US012707785B2

(12) United States Patent
Im et al.

(10) Patent No.: US 12,707,785 B2
(45) Date of Patent: Aug. 11, 2026

(54) DISPLAY DEVICE WITH OVERLAPPING CONNECTION ELECTRODES

(71) Applicant: Samsung Display Co., LTD., Yongin-si (KR)

(72) Inventors: Hyun Deok Im, Yongin-si (KR); Jong Hyuk Kang, Yongin-si (KR); Buem Joon Kim, Yongin-si (KR); Soo Jo Ock, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 416 days.

(21) Appl. No.: 18/394,900

(22) Filed: Dec. 22, 2023

(65) Prior Publication Data

US 2024/0222583 A1 Jul. 4, 2024

(30) Foreign Application Priority Data

Jan. 4, 2023 (KR) ........................ 10-2023-0001189

(51) Int. Cl.
*H10W 90/00* (2026.01)
*H10H 20/857* (2025.01)

(52) U.S. Cl.
CPC .......... *H10H 20/857* (2025.01); *H10W 90/00* (2026.01)

(58) Field of Classification Search
None
See application file for complete search history.

(56) References Cited

U.S. PATENT DOCUMENTS

2021/0111323 A1* 4/2021 Kim ...................... H10W 90/00
2021/0384252 A1* 12/2021 Lee ...................... H10H 29/142
2021/0391380 A1* 12/2021 Li ........................ H10H 20/857
2021/0391503 A1* 12/2021 Lee .................... H10H 20/8316

FOREIGN PATENT DOCUMENTS

KR 10-1490758 B1 2/2015

* cited by examiner

*Primary Examiner* — Sue A Purvis
*Assistant Examiner* — Seyon Ali-Simah Punchbeddell
(74) *Attorney, Agent, or Firm* — Womble Bond Dickinson (US) LLP

(57) ABSTRACT

A includes electrodes comprising a first electrode, a second electrode, and a third electrode extending in a first direction and spaced in a second direction crossing the first direction, a first light emitting element, a second light emitting element, a third light emitting element, and a fourth light emitting element on the electrodes spaced in the second direction, a first connection electrode on the first electrode and connected to one end of the first light emitting element, a second connection electrode on the second electrode and connected to one end of the fourth light emitting element, a third connection electrode on the first electrode and the third electrode, and connected to an other end of the first light emitting element and one end of the second light emitting element, a fourth connection electrode, and a fifth connection electrode.

20 Claims, 16 Drawing Sheets

DISPLAY DEVICE WITH OVERLAPPING CONNECTION ELECTRODES

CROSS-REFERENCE TO RELATED APPLICATION

This application claims priority to and the benefit of Korean Patent Application No. 10-2023-0001189, filed on Jan. 4, 2023, in the Korean Intellectual Property Office, the entire disclosure of which is incorporated by reference herein.

BACKGROUND

1. Field

The present disclosure relates to a display device.

2. Description of the Related Art

The importance of display devices has steadily increased with the development of multimedia technology. In response thereto, various types of display devices such as an organic light emitting diode (OLED) display, a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LEDs), and examples of the light emitting diodes include an organic light emitting diode (OLED) using an organic material as a fluorescent material and an inorganic light emitting diode using an inorganic material as a fluorescent material.

SUMMARY

Aspects and features of embodiments of the present disclosure provide a display device capable of improving light emission efficiency by reducing the number of light emitting elements which do not emit light.

However, aspects and features of embodiments of the present disclosure are not restricted to the one set forth herein. The above and other aspects and features of embodiments of the present disclosure will become more apparent to one of ordinary skill in the art to which the present disclosure pertains by referencing the detailed description of the present disclosure given below.

According to one or more embodiments of the present disclosure, a display device includes electrodes including a first electrode, a second electrode and a third electrode extending in a first direction and spaced in a second direction crossing the first direction, a first light emitting element, a second light emitting element, a third light emitting element, and a fourth light emitting element on the electrodes spaced in the second direction, a first connection electrode on the first electrode and connected to one end of the first light emitting element, a second connection electrode on the second electrode and connected to one end of the fourth light emitting element, a third connection electrode on the first electrode and the third electrode, and connected to an other end of the first light emitting element and one end of the second light emitting element, a fourth connection electrode on the first electrode and the second electrode, and connected to an other end of the second light emitting element and one end of the third light emitting element, a fifth connection electrode on the first electrode and the third electrode, and connected to an other end of the third light emitting element and an other end of the fourth light emitting element, and an insulating layer between the third connection electrode and the fourth connection electrode, wherein the third connection electrode and the fourth connection electrode overlap each other having the insulating layer disposed therebetween.

In one or more embodiments, the third connection electrode includes a first extension portion extending in the first direction, a second extension portion parallel to the first extension portion, and a first connection portion connecting the first extension portion and the second extension portion, and wherein the fourth connection electrode includes a third extension portion extending in the first direction, a fourth extension portion parallel to the third extension portion, and a second connection portion connecting the third extension portion and the fourth extension portion.

In one or more embodiments, the first connection portion of the third connection electrode and the second connection portion of the fourth connection electrode extend in the second direction, and wherein the second extension portion of the third connection electrode and the second connection portion of the fourth connection electrode overlap each other.

In one or more embodiments, the display device further includes a bank layer on the first electrode, the second electrode, and the third electrode to divide an emission area where the first light emitting element, the second light emitting element, the third light emitting element, and the fourth light emitting element are located, and a sub-area other than the emission area.

In one or more embodiments, the first connection portion of the third connection electrode and the second connection portion of the fourth connection electrode are in the sub-area, and wherein the first connection portion and the second connection portion do not overlap each other in the sub-area.

In one or more embodiments, the first extension portion, the second extension portion, the third extension portion, and the fourth extension portion cross the bank layer to extend to the sub-area.

In one or more embodiments, the fourth connection electrode includes a fifth extension portion extending in the first direction, and a third connection portion connecting the fifth extension portion and the fourth extension portion, and wherein the third connection portion extends in the second direction and is in the emission area.

In one or more embodiments, the fifth connection electrode includes a sixth extension portion extending in the first direction, a seventh extension portion parallel to the sixth extension portion and a fourth connection portion connecting the sixth extension portion and the seventh extension portion, and wherein the fourth connection portion extends in the second direction and is in the sub-area.

In one or more embodiments, the fifth extension portion of the fourth connection electrode is connected to the one end of the third light emitting element, the sixth extension portion of the fifth connection electrode is connected to the other end of the third light emitting element, the seventh extension portion of the fifth connection electrode is connected to the one end of the fourth light emitting element, and the second connection electrode is connected to the other end of the fourth light emitting element.

In one or more embodiments, the fourth extension portion of the fourth connection electrode is between the first electrode and the second extension portion of the third connection electrode, and does not overlap the first light emitting element, the second light emitting element, the third light emitting element, and the fourth light emitting element.

In one or more embodiments, the first connection electrode is connected to the one end of the first light emitting element, wherein the first extension portion of the third connection electrode is connected to the other end of the first light emitting element, wherein the second extension portion of the third connection electrode is connected to the one end of the second light emitting element, and wherein the third extension portion of the fourth connection electrode is connected to the other end of the second light emitting element.

In one or more embodiments, the first connection electrode, the second connection electrode, and the fourth connection electrode are under the insulating layer, and wherein the third connection electrode and the fifth connection electrode are on the insulating layer.

According to one or more embodiments of the present disclosure, a display device includes electrodes including a first electrode, a second electrode, and a third electrode extending in a first direction and spaced in a second direction crossing the first direction, a first light emitting element, a second light emitting element, a third light emitting element, and a fourth light emitting element on the electrodes spaced in the second direction, a bank layer on the first electrode, the second electrode, and the third electrode to divide the emission area where the first light emitting element, the second light emitting element, the third light emitting element, and the fourth light emitting element are located and a sub-area other than the emission area, a first connection electrode on the first electrode and connected to one end of the first light emitting element, a second connection electrode on the second electrode and connected to one end of the fourth light emitting element, a third connection electrode on the first electrode and the third electrode, and connected to an other end of the first light emitting element and one end of the second light emitting element, a fourth connection electrode on the first electrode, the second electrode and the third electrode to be connected to the other end of the second light emitting element and one end of the third light emitting element, a fifth connection electrode on the first electrode and the third electrode, and connected to an other end of the third light emitting element and an other end of the fourth light emitting element, and an insulating layer between the third connection electrode and the fourth connection electrode and between the fourth connection electrode and the fifth connection electrode, and wherein the third connection electrode and the fourth connection electrode overlap each other on the bank layer, and wherein the fourth connection electrode and the fifth connection electrode overlap each other on the bank layer.

In one or more embodiments, the third connection electrode includes a first extension portion extending in the first direction, a second extension portion parallel to the first extension portion, and a first connection portion connecting the first extension portion and the second extension portion, wherein the fourth connection electrode includes a third extension portion extending in the first direction, a fourth extension portion parallel to the third extension portion, a fifth extension portion extending in the first direction, a second connection portion connecting the third extension portion and the fourth extension portion, and a third connection portion connecting the fourth extension portion and the fifth extension portion, wherein the fifth connection electrode includes a sixth extension portion extending in the first direction, a seventh extension portion parallel to the sixth extension portion, and a fourth connection portion connecting the sixth extension portion and the seventh extension portion.

In one or more embodiments, on the bank layer, the first connection portion of the third connection electrode and the second connection portion of the fourth connection electrode overlap each other, and the fifth extension portion of the fourth connection electrode and the fourth connection portion of the fifth connection electrode overlap each other.

In one or more embodiments, on the bank layer, the first connection electrode and the first connection portion of the third connection electrode overlap each other, and the second extension portion of the third connection electrode and the second connection portion of the fourth connection electrode overlap each other.

In one or more embodiments, the second extension portion of the third connection electrode is parallel to the fourth extension portion of the fourth connection electrode and does not overlap each other.

In one or more embodiments, the second extension portion of the third connection electrode is parallel to the fourth extension portion of the fourth connection electrode and overlap each other.

In one or more embodiments, the third connection portion of the fourth connection electrode overlaps the seventh extension portion of the fifth connection electrode in the emission area.

In one or more embodiments, the length of the first connection portion of the third connection electrode is the same as the length of the fourth connection portion of the fifth connection electrode, and wherein each of the lengths of the first connection portion of the third connection electrode and the fourth connection portion of the fifth connection electrode is greater than the length of the second connection portion.

A display device according to one or more embodiments may improve light emission efficiency by reducing the number of light emitting elements that do not emit light. In addition, light emission efficiency may be improved by disposing the light emitting elements to be adjacent to the center of an emission area.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings and scope of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described with reference to the accompanying drawings.

Figure 1:
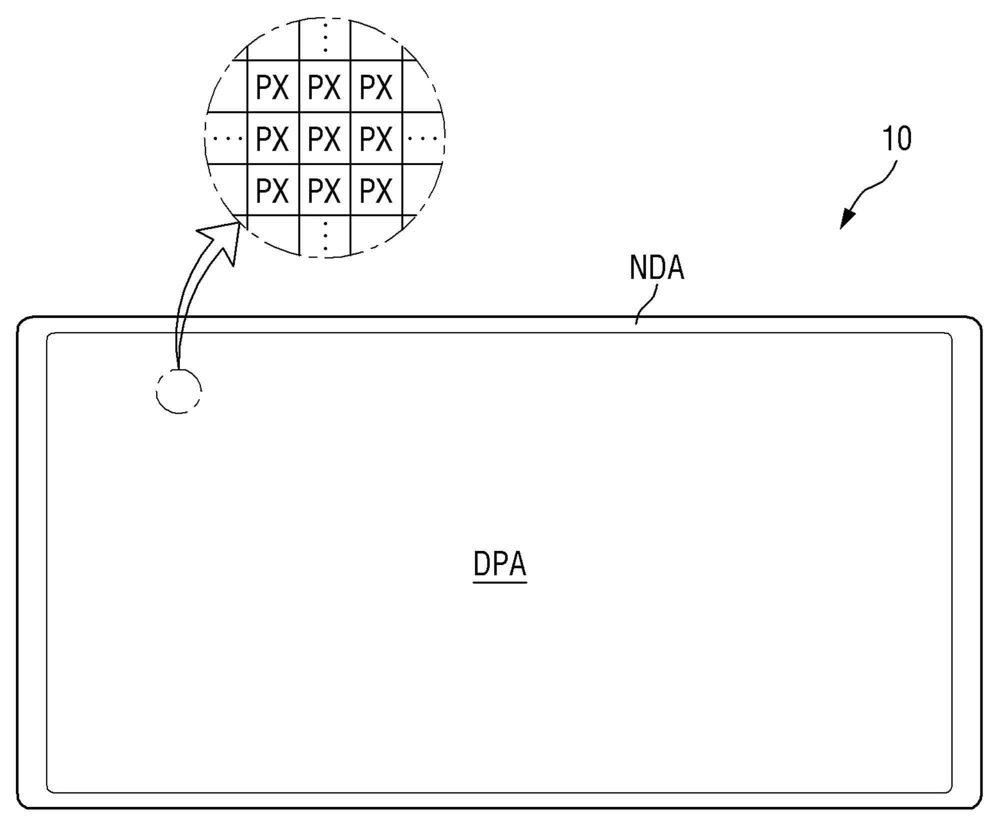
FIG. 1 is a schematic plan view of a display device according to one or more embodiments.
Figure 1:
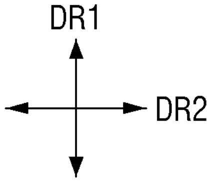

FIG. 1 is a schematic plan view of a display device according to one or more embodiments.

Referring to FIG. 1, a display device 10 displays a moving image or a still image. The display device 10 may refer to all electronic devices that provide display screens. For example, televisions, laptop computers, monitors, billboards, the Internet of Things (IOT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and/or the like, which provide display screens, may be included in the display device 10.

The display device 10 includes a display panel providing the display screen. Examples of the display panel may include an inorganic light emitting diode display panel, an organic light emitting display panel, a quantum dot light emitting display panel, a plasma display panel, a field emission display panel, and the like. Hereinafter, a case where an inorganic light emitting diode display panel is applied as an example of the display panel will be described by way of example, but the present disclosure is not limited thereto, and the same technical spirit may be applied to other display panels if applicable.

A shape of the display device 10 may be variously modified. For example, the display device 10 may have a shape such as a rectangular shape with a width greater than a length, a rectangular shape with a length greater than a width, a square shape, a rectangular shape with rounded corners (vertices), other polygonal shapes, or a circular shape. A shape of a display area DPA of the display device 10 may also be similar to an overall shape of the display device 10. In FIG. 1, the display device 10 having a rectangular shape with a greater length in a second direction DR2 is illustrated.

The display device 10 may include a display area DPA and a non-display area NDA along an edge or periphery of the display area DPA. The display area DPA is an area in which an image may be displayed, and the non-display area NDA is an area in which no image is displayed. The display area DPA may also be referred to as an active area, and the non-display area NDA may also be referred to as a non-active area. The display area DPA may occupy substantially the center (or a central region) of the display device 10.

The display area DPA may include a plurality of pixels PX. The plurality of pixels PX may be arranged in a matrix direction. For example, the plurality of pixels PX may be arranged along rows and columns of a matrix. A shape of each pixel PX may be a rectangular shape or a square shape in a plan view, but is not limited thereto, and may also be a rhombic shape of which each side is inclined with respect to one direction. The respective pixels PX may be alternately arranged in a stripe type or an island type. In addition, each of the pixels PX may include one or more light emitting elements emitting light of a specific wavelength band to display a specific color.

The non-display area NDA may be disposed around the display area DPA. The non-display area NDA may entirely or partially surround the display area DPA. The display area DPA may have a rectangular shape, and the non-display area NDA may be disposed adjacent to four sides of the display area DPA. The non-display area NDA may constitute a bezel of the display device 10. Lines or circuit drivers included in the display device 10 may be disposed or external devices may be mounted, in each of the non-display areas NDA.

Figure 2:
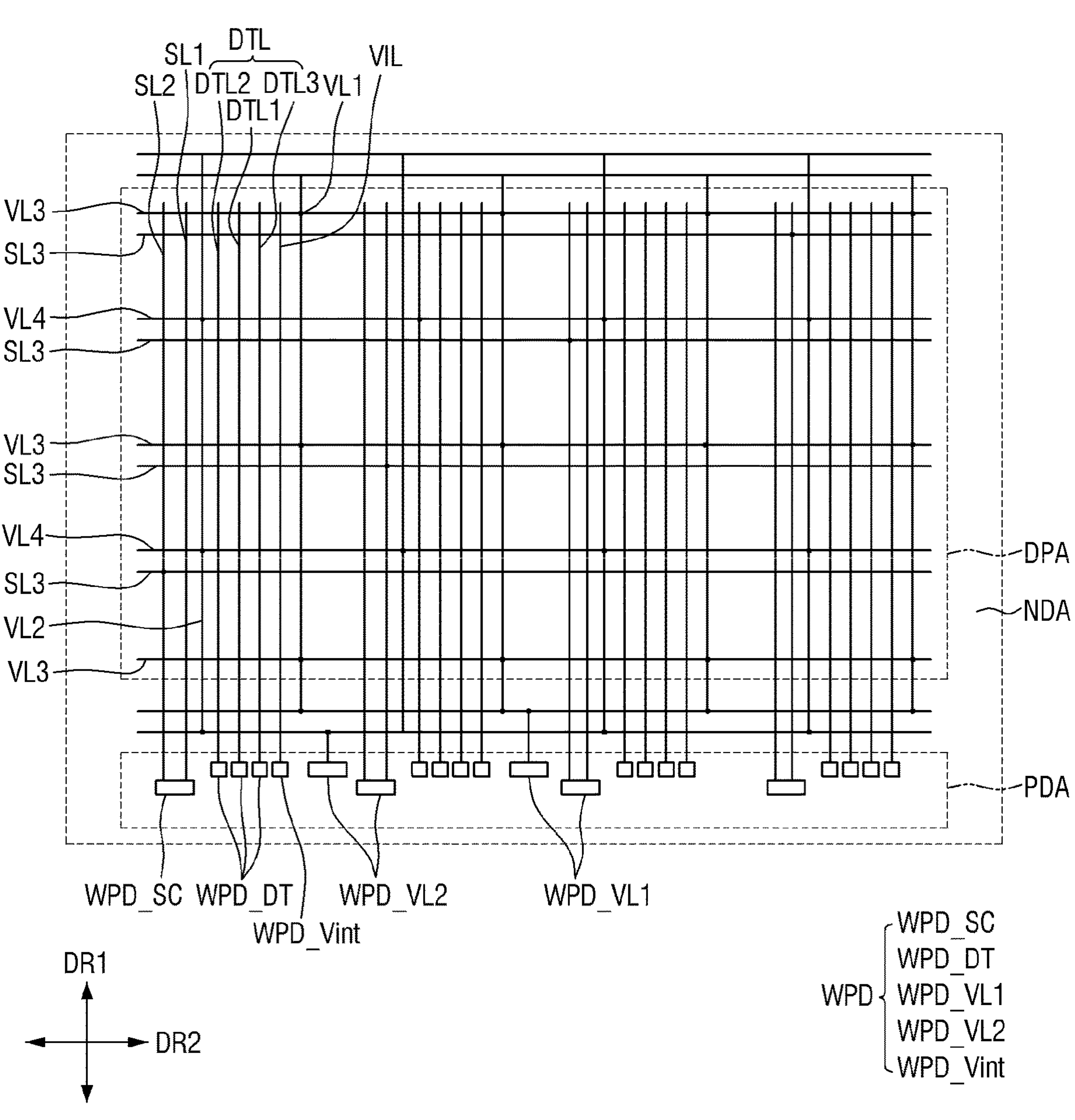
FIG. 2 is a plan view illustrating a layout of a plurality of lines included in the display device according to one or more embodiments.

FIG. 2 is a plan view illustrating a layout of a plurality of lines included in the display device according to one or more embodiments.

Referring to FIG. 2, the display device 10 may include a plurality of lines. The display device 10 may include a plurality of scan lines SL: SL1, SL2, and SL3, a plurality of data lines DTL: DTL1, DTL2, and DTL3, initialization voltage lines VIL, and a plurality of voltage lines VL: VL1, VL2, VL3, and VL4. In addition, other lines may be further disposed in the display device 10. The plurality of lines may include lines formed of a first conductive layer and extending in a first direction DR1 and lines formed of a third conductive layer and extending in the second direction DR2. However, extension directions of the respective lines are not limited thereto.

First scan lines SL1 and second scan lines SL2 may be disposed to extend in the first direction DR1. The first scan line SL1 and the second scan line SL2 may be disposed in a state in which they are adjacent to each other, and may be disposed to be spaced from other first scan lines SL1 and second scan lines SL2 in the second direction DR2. The first scan lines SL1 and the second scan lines SL2 may be connected to scan wiring pads WPD_SC connected to a scan driver. The first scan lines SL1 and the second scan lines SL2 may be disposed to extend from a pad area PDA disposed in the non-display area NDA to the display area DPA.

A third scan line SL3 may be disposed to extend in the second direction DR2, and may be disposed to be spaced apart from the other third scan lines SL3 in the first direction DR1. One third scan line SL3 may be connected to one or more first scan lines SL1 or one or more second scan lines SL2. The plurality of scan lines SL may have a mesh structure in the entirety of the display area DPA, but are not limited thereto.

The data lines DTL may be disposed to extend in the first direction DR1. The data lines DTL may include first data lines DTL1, second data lines DTL2, and third data lines DTL3, and one first to third data lines DTL1, DTL2, and DTL3 form one group and are disposed adjacent to each other. Each of the data lines DTL1, DTL2, and DTL3 may be disposed to extend from the pad area PDA disposed in the non-display area NDA to the display area DPA. However, the present disclosure is not limited thereto, and the plurality of data lines DTL may also be disposed to be spaced from each other at equal intervals between a first voltage line VL1 and a second voltage line VL2 to be described later.

The initialization voltage lines VIL may be disposed to extend in the first direction DR1. The initialization voltage line VIL may be disposed between the data lines DTL and the first voltage line VL1. The initialization voltage lines VIL may be disposed to extend from the pad area PDA disposed in the non-display area NDA to the display area DPA.

First voltage lines VL1 and second voltage lines VL2 are disposed to extend in the first direction DR1, and third voltage lines VL3 and fourth voltage lines VL4 are disposed to extend in the second direction DR2. The first voltage lines VL1 and the second voltage lines VL2 may be alternately disposed in the second direction DR2, and the third voltage lines VL3 and the fourth voltage lines VL4 may be alternately disposed in the first direction DR1. The first voltage lines VL1 and the second voltage lines VL2 may be disposed to extend in the first direction DR1 to cross the display area DPA, and some of each of the third voltage lines VL3 and the fourth voltage lines VL4 may be disposed in the display area DPA and the others of each of the third voltage lines VL3 and the fourth voltage lines VL4 may be disposed in the non-display areas NDA positioned on both sides of the display area DPA in the first direction DR1. The plurality of voltage lines VL may have a mesh structure in the entirety of the display area DPA. However, the present disclosure is not limited thereto.

The first scan line SL1, the second scan line SL2, the data line DTL, the initialization voltage line VIL, the first voltage line VL1 and the second voltage line VL2 may be electrically connected to at least one wiring pad WPD. Each wiring pad WPD may be disposed in the non-display area NDA. In one or more embodiments, each of the wiring pads WPD may be disposed in the pad area PDA positioned on the lower side of the display area DPA, which is the other side of the display area DPA in the first direction DR1. The first scan line SL1 and the second scan line SL2 are connected to a scan wiring pad WPD_SC disposed in the pad area PDA, and the plurality of data lines DTL are connected to different data wiring pads WPD_DT, respectively. The initialization voltage line VIL is connected to an initialization line pad WPD_Vint, the first voltage line VL1 is connected to a first voltage line pad WPD_VL1, and the second voltage line VL2 is connected to a second voltage line pad WPD_VL2. An external device may be mounted on the wiring pad WPD. The external device may be mounted on the wiring pad WPD through an anisotropic conductive film, ultrasonic bonding, and/or the like. It has been illustrated in FIG. 2 that each of the wiring pads WPD is disposed in the pad area PDA disposed on the lower side of the display area DPA, but the present disclosure is not limited thereto. Some of a plurality of wiring pads WPD may also be disposed on the upper side of the display area DPA or on any one of the left side and the right side of the display area DPA.

Each pixel PX or sub-pixel SPXn (n is an integer of 1 to 3) of the display device 10 includes a pixel driving circuit. The above-described lines may apply driving signals to the respective pixel driving circuits while passing through the respective pixels PX or around the respective pixels PX. The pixel driving circuit may include a transistor and a capacitor. The numbers of transistors and capacitors in each pixel driving circuit may be variously modified. According to one or more embodiments, each sub-pixel SPXn of the display device 10 may have a 3T1C structure in which the pixel driving circuit includes three transistors and one capacitor. Hereinafter, the pixel driving circuit will be described using the 3T1C structure as an example, but the present disclosure is not limited thereto, and various other modified structures such as a 2T1C structure, a 7T1C structure, and a 6T1C structure may be applied.

Figure 3:
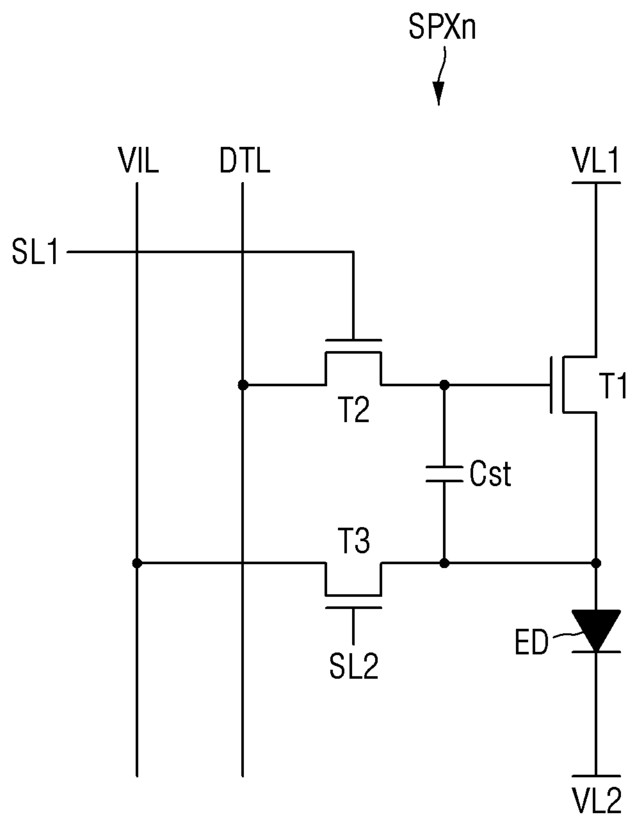
FIG. 3 is equivalent circuit diagram of one sub-pixel of the display device according to one or more embodiments.

FIG. 3 is equivalent circuit diagram of one sub-pixel of the display device according to one or more embodiments.

Referring to FIG. 3, each sub-pixel SPXn of the display device 10 according to one or more embodiments includes three transistors T1, T2, and T3 and one storage capacitor Cst, in addition to a light emitting diode ED.

The light emitting diode ED emits light according to a current supplied through a first transistor T1. The light emitting diode ED includes a first electrode, a second electrode, and at least one light emitting element disposed between the first electrode and the second electrode. The light emitting element may emit light of a specific wavelength band by electrical signals transferred from the first electrode and the second electrode.

One end of the light emitting diode ED may be connected to a source electrode of the first transistor T1, and the other end of the light emitting diode ED may be connected to the second voltage line VL2 to which a low potential voltage (hereinafter, referred to as a second source voltage) lower than a high potential voltage (hereinafter, referred to as a first source voltage) of the first voltage line VL1 is supplied.

The first transistor T1 adjusts a current flowing from the first voltage line VL1 to which the first source voltage is supplied to the light emitting diode ED according to a voltage difference between a gate electrode and the source electrode of the first transistor T1. As an example, the first transistor T1 may be a driving transistor for driving the light emitting diode ED. The gate electrode of the first transistor T1 may be connected to a source electrode of a second transistor T2, the source electrode of the first transistor T1 may be connected to the first electrode of the light emitting diode ED, and a drain electrode of the first transistor T1 may be connected to the first voltage line VL1 to which the first source voltage is applied.

The second transistor T2 is turned on by a scan signal of the first scan line SL1 to connect the data line DTL to the gate electrode of the first transistor T1. A gate electrode of the second transistor T2 may be connected to the first scan line SL1, the source electrode of the second transistor T2 may be connected to the gate electrode of the first transistor T1, and a drain electrode of the second transistor T2 may be connected to the data line DTL.

A third transistor T3 is turned on by a scan signal of the second scan line SL2 to connect the initialization voltage line VIL to one end of the light emitting diode EL. A gate electrode of the third transistor T3 may be connected to the second scan line SL2, a drain electrode of the third transistor T3 may be connected to the initialization voltage line VIL, and a source electrode of the third transistor T3 may be connected to one end of the light emitting diode ED or the source electrode of the first transistor T1.

In one or more embodiments, the source electrode and the drain electrode of each of the transistors T1, T2, and T3 are not limited to those described above, and vice versa. Each of the transistors T1, T2, and T3 may be formed as a thin film transistor (TFT). It has been mainly described in FIG. 3 that each of the transistors T1, T2, and T3 is formed as an N-channel metal oxide semiconductor field effect transistor (MOSFET), but the present disclosure is not limited thereto. That is, each of the transistors T1, T2, and T3 may be formed as a P-channel MOSFET or some of the transistors T1, T2, and T3 may be formed as an N-channel MOSFET and the others of the transistors T1, T2, and T3 may be formed as a P-channel MOSFET.

The storage capacitor Cst is formed between the gate electrode and the source electrode of the first transistor T1. The storage capacitor Cst stores a difference voltage between a gate voltage and a source voltage of the first transistor T1.

The gate electrode of the second transistor T2 may be connected to the first scan line SL1, and the gate electrode of the third transistor T3 may be connected to the second scan line SL2. The first scan line SL1 and the second scan line SL2 may be different scan lines, and the second transistor T2 and the third transistor T3 may be turned on by scan signals applied from different scan lines. However, the present disclosure is not limited there. The gate electrodes of the second transistor T2 and the third transistor T3 may be connected to the same scan line SL and may be concurrently (e.g., simultaneously) turned on by a scan signal applied from the same scan line.

Hereinafter, a structure of one pixel PX of the display device 10 according to one or more embodiments will be described in detail with reference to other drawings.

Figure 4:
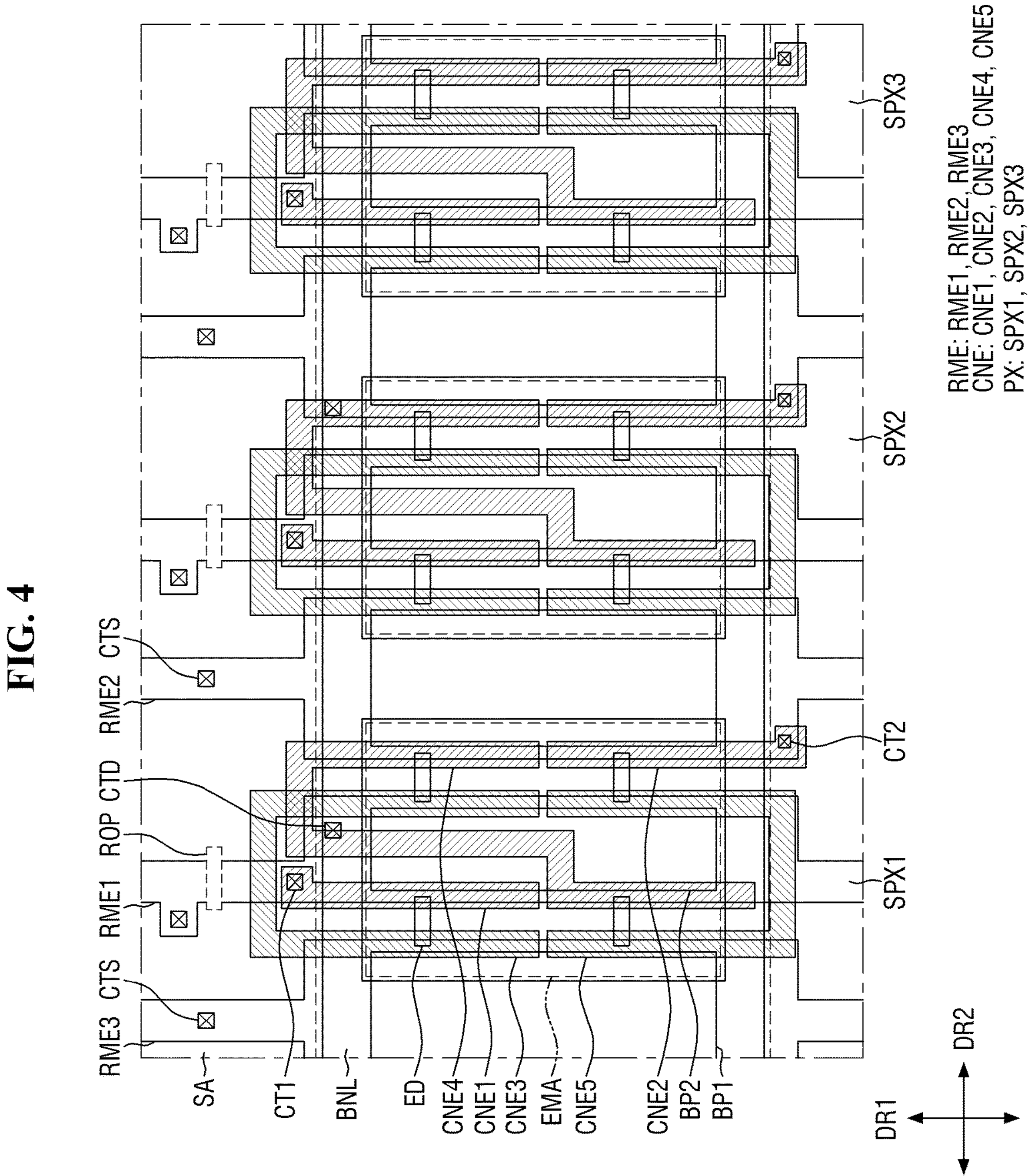
FIG. 4 is a plan view illustrating one pixel of the display device according to one or more embodiments.

FIG. 4 is a plan view illustrating one pixel of the display device according to one or more embodiments.

Referring to FIG. 4, each of the plurality of pixels PX of the display device 10 may include a plurality of sub-pixels SPXn (n is an integer of 1 to 3). For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. As an example, the first color may be red, the second color may be green, and the third color may be blue. However, the present disclosure is not limited thereto, and the respective sub-pixels SPXn may also emit light of the same color. In one or more embodiments, the respective sub-pixels SPXn may emit blue light. Also, it has been illustrated in FIG. 4 that one pixel PX includes three sub-pixels SPXn, but the present disclosure is not limited thereto, and the pixel PX may include a larger number of sub-pixels SPXn.

Each of the sub-pixels SPXn of the display device 10 may include an emission area EMA and a non-emission area. The emission area EMA may be an area in which the light emitting elements ED are disposed to emit light of a specific wavelength band and the non-emission area may be an area in which the light emitting elements ED are not disposed and light emitted from the light emitting elements ED does not arrive, and thus, the light is not emitted. The emission area EMA may include an area in which the light emitting elements ED are disposed and an area adjacent thereto in which the light emitted from the light emitting elements ED is propagated to.

However, the present disclosure is not limited thereto, and the emission area EMA may also include an area in which the light emitted from the light emitting elements ED is reflected or refracted by other members and then emitted. The plurality of light emitting elements ED may be disposed in each sub-pixel SPXn, and an emission area EMA including an area in which the plurality of light emitting elements ED are disposed and an area adjacent to the plurality of light emitting elements ED may be formed.

It has been illustrated in FIG. 4 that the emission areas EMA of the respective sub-pixels SPXn each have a substantially uniform area, but the present disclosure is not limited thereto. In one or more embodiments, the respective emission areas EMA of the respective sub-pixels SPXn may also have different areas depending on colors or wavelength bands of light emitted from the light emitting elements ED disposed in the corresponding sub-pixels.

In addition, each sub-pixel SPX may further include a sub-area SA disposed in the non-emission area. The sub-area SA may be disposed in the first direction DR1 of the emission area EMA and may be disposed between the emission areas EMA of the sub-pixels SPXn adjacent to each other in the first direction DR1. For example, the plurality of emission areas EMA are spaced from each other in the second direction DR2, and the plurality of emission areas EMA and the sub-area SA are repeatedly arranged along the first direction DR1, but the emission area EMA and the sub area SA may be alternately arranged. However, the present disclosure is not limited thereto, and the emission areas EMA and the sub-areas SA in the plurality of pixels PX may also have an arrangement different from that of FIG. 4. One pixel PX shown in FIG. 4 may include the emission area EMA and the sub-area SA disposed above the emission area EMA in the first direction DR1 in one sub-pixel SPXn, and a portion of the emission area EMA disposed in the opposite direction to the first direction DR1 may be a sub-area SA of another sub-pixel SPXn. In the present embodiment, the sub-area SA may be continuously disposed in each sub-pixel SPXn and may be continuously disposed in each pixel PXn.

A bank layer BNL may be disposed between the sub-areas SA and the emission areas EMA, and a distance between the sub-areas SA and the emission areas EMA may vary according to a width of the bank layer BNL. Light may not exit from the sub-area SA because the light emitting elements ED are not disposed in the sub-area SA, but parts of electrodes RME1, RME2, and RME3 disposed in each subpixel SPXn may be disposed in the sub-area SA. The electrodes RME disposed in different sub-pixels SPXn may be separated from each other in a separation part ROP of the sub-area SA.

The bank layer BNL may include parts extending in the first direction DR1 and the second direction DR2 in a plan view to form a ladder-like pattern in the entire display area DPA. The bank layer BNL may be disposed at the boundary of each sub-pixel SPXn to separate neighboring sub-pixels SPXn. In addition, the bank layer BNL may surround the emission area EMA disposed in each sub-pixel SPXn to separate them from each other. The bank layer BNL may divide the emission area EMA and the sub-area SA.

The display device 10 may include the plurality of electrodes RME: RME1, RME2, and RME3, bank patterns BP1 and BP2, light emitting elements ED: ED1 and ED2 (e.g., see FIG. 5), and connection electrodes CNE: CNE1, CNE2, CNE3, CNE4, CNE5. The configurations thereof will be described later.

Pixels PX or sub-pixels SPXn of the display device 10 may include pixel driving circuits. The above-described lines may apply driving signals to the respective pixel driving circuits while passing through the respective pixels PX or around the respective pixels PX. The pixel driving circuit may include a transistor and a capacitor. The numbers of transistors and capacitors in each pixel driving circuit may be variously modified. In one example, the pixel driving circuits may have a "3T1C" structure including three transistors and one capacitor, as illustrated in FIG. 3. The pixel driving circuits will hereinafter be described as having the "3T1C" structure, but the present disclosure is not limited thereto. Alternatively, various other structures such as a "2T1C", "7T1C", or "6T1C" structure may also be applicable to the pixel driving circuits.

Figure 5:
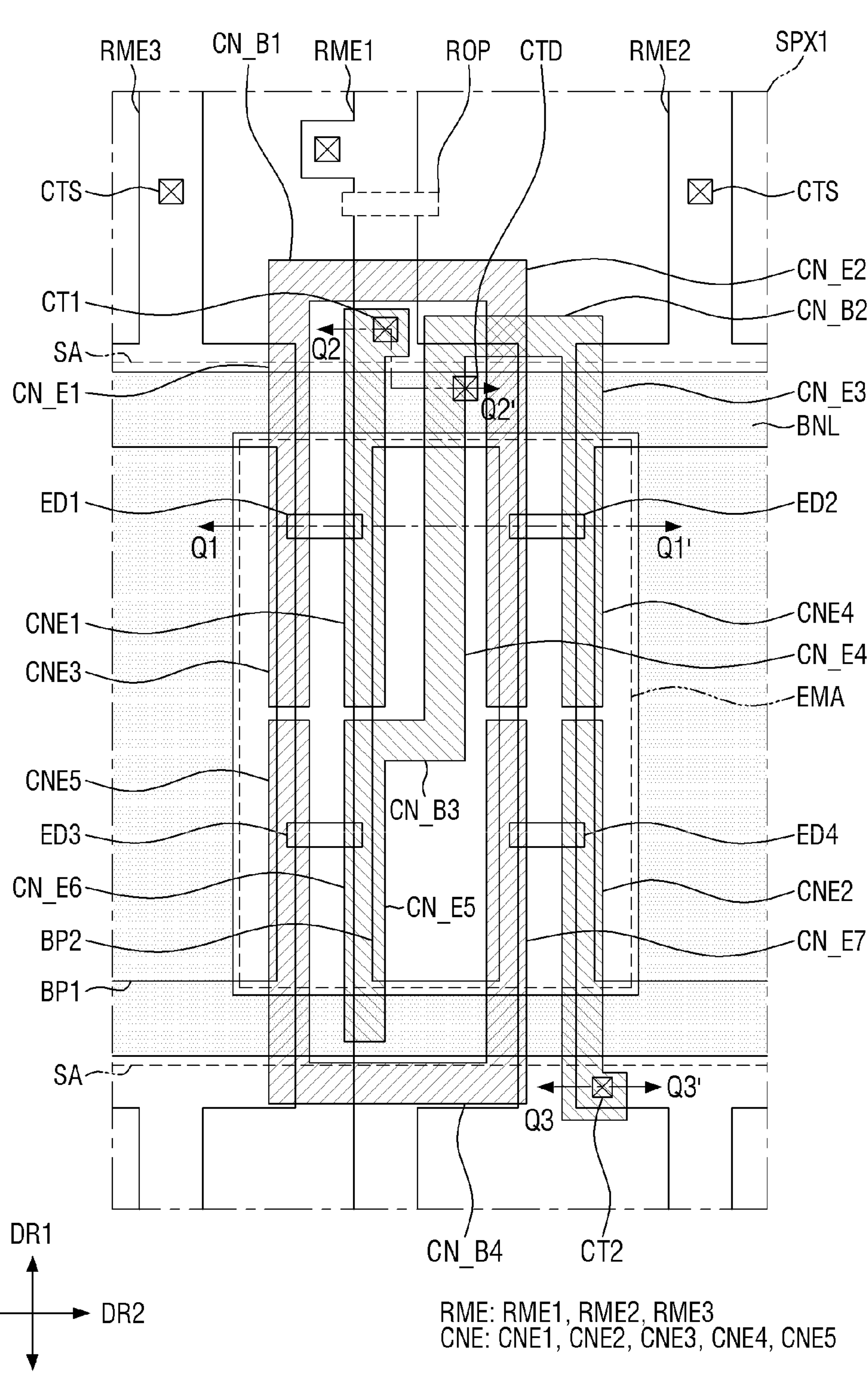
FIG. 5 is a plan view of a first subpixel of FIG. 4.
Figure 6:
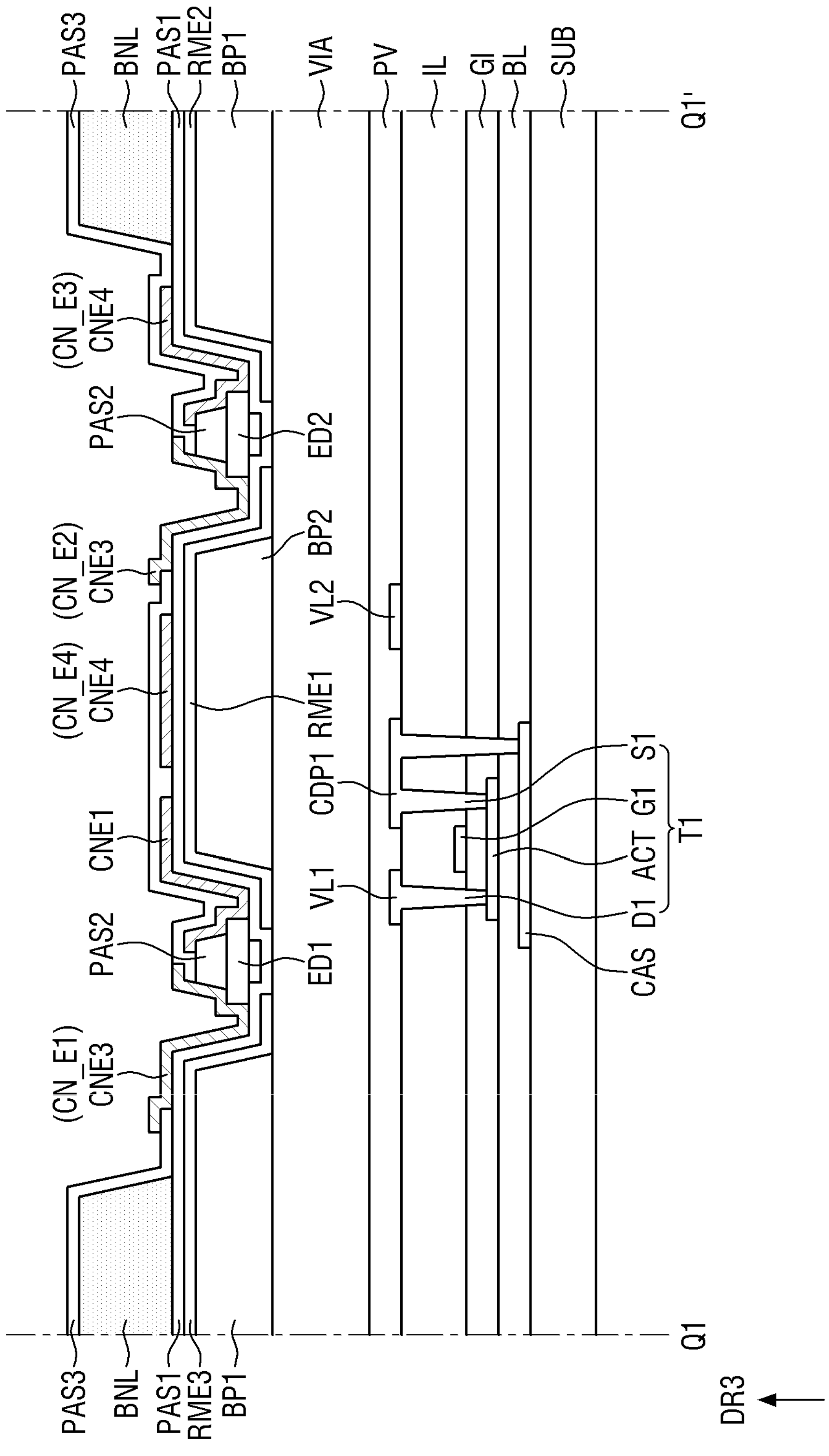
FIG. 6 is a cross-sectional view taken along the line Q1-Q1' of FIG. 5
Figure 7:
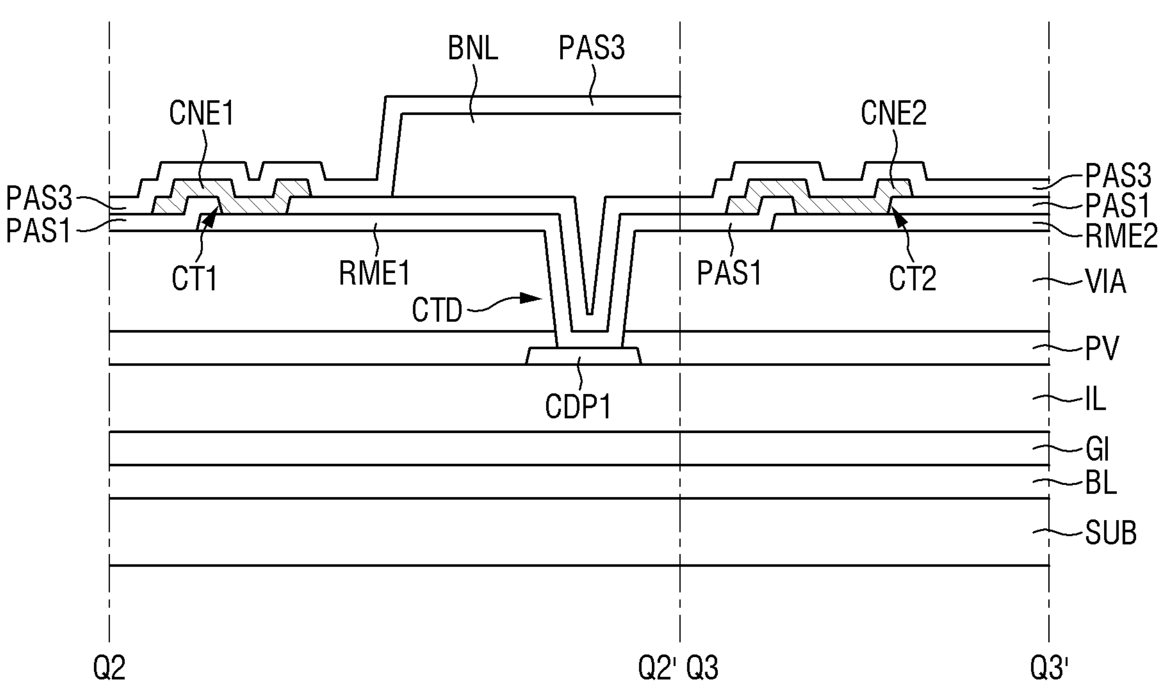
FIG. 7 is a cross-sectional view taken along the line Q2-Q2' and the line Q3-Q3' of FIG. 5.
Figure 8:
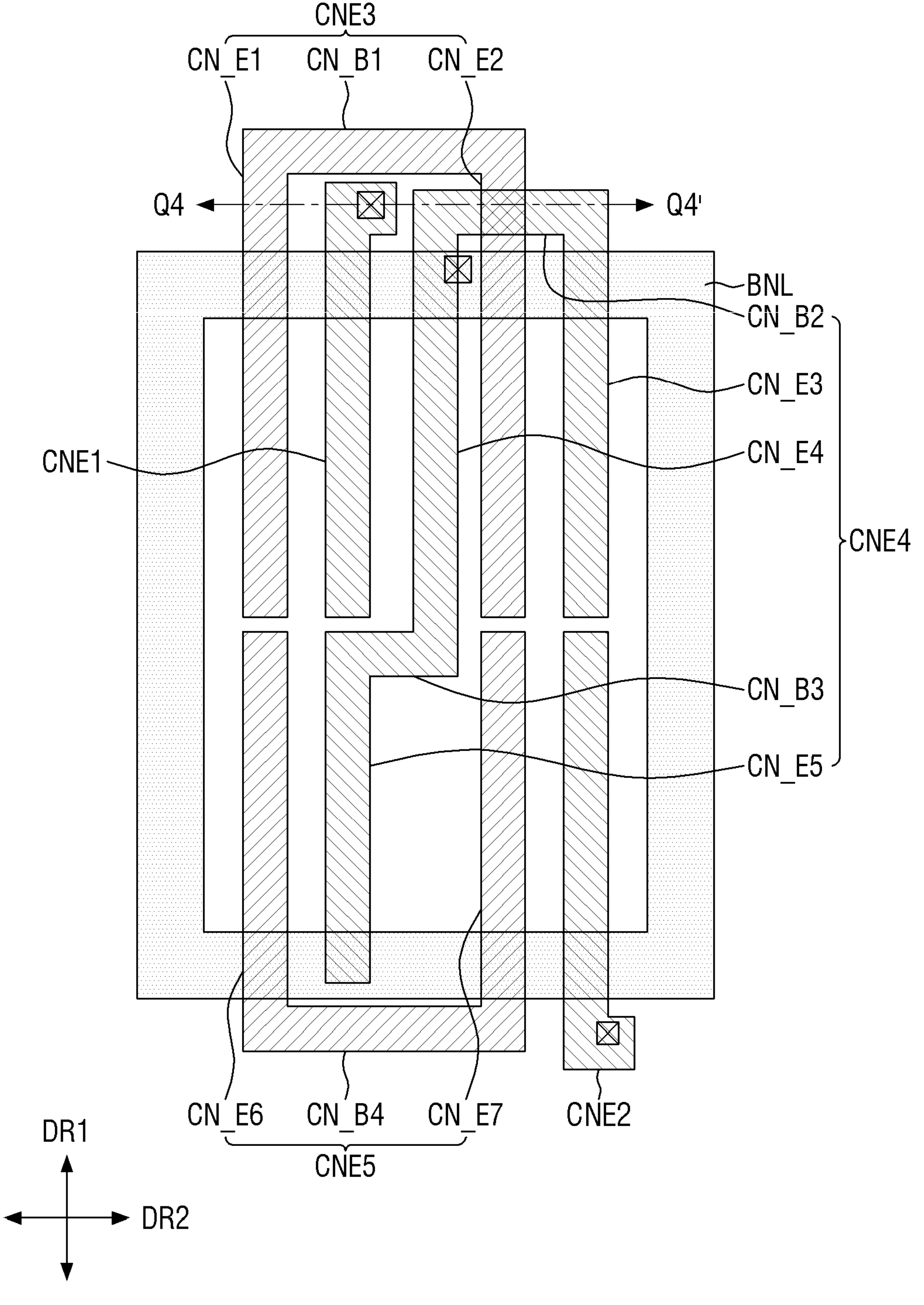
FIG. 8 is a plan view illustrating the connecting electrodes and the bank layer of the first sub-pixel of FIG. 5.
Figure 9:
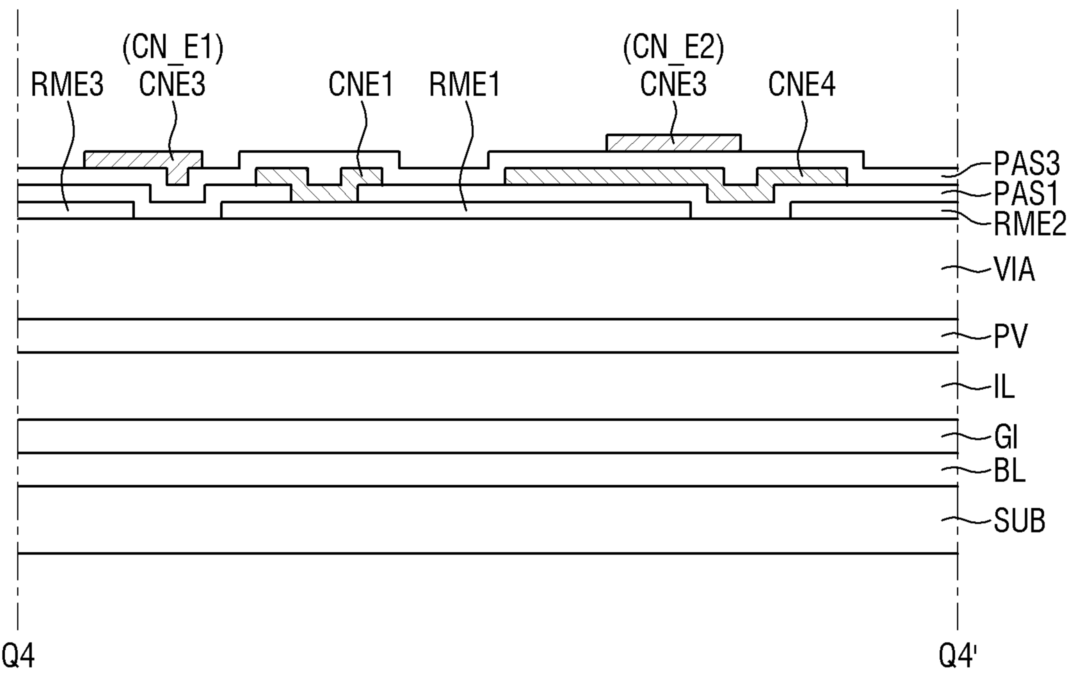
FIG. 9 is a cross-sectional view taken along the line Q4-Q4' of FIG. 8.

FIG. 5 is a plan view of a first subpixel of FIG. 4. FIG. 6 is a cross-sectional view taken along the line Q1-Q1' of FIG. 5. FIG. 7 is a cross-sectional view taken along the line Q2-Q2' and the line Q3-Q3' of FIG. 5. FIG. 8 is a plan view illustrating the connecting electrodes and the bank layer of the first sub-pixel of FIG. 5. FIG. 9 is a cross-sectional view taken along the line Q4-Q4' of FIG. 8.

Referring to FIGS. 5 through 9 and further to FIG. 4, the display device 10 may include a substrate SUB, a semiconductor layer, a plurality of conductive layers and a plurality of insulating layers that are disposed on the substrate SUB. The semiconductor layer, the conductive layers, and the insulating layers may form a circuit layer and a display element layer of the display device 10.

Specifically, the substrate SUB may be an insulating substrate. The substrate SUB may be made of an insulating material such as glass, quartz and a polymer resin. The substrate SUB may be either a rigid substrate or a flexible substrate that can be bent, folded, and/or rolled.

A first conductive layer may be disposed on the substrate SUB. The first conductive layer may include a bottom metal layer CAS. The bottom metal layer CAS is disposed to overlap an active layer ACT of a first transistor T1 in a thickness direction of the substrate SUB (e.g., a third direction DR3). The bottom metal layer CAS may include a material that blocks light, and thus can prevent light from entering the active layer ACT1 of the first transistor T1. It is, however, to be noted that the bottom metal layer CAS may be eliminated.

A buffer layer BL may be disposed on the bottom metal layer CAS and the substrate SUB. The buffer layer BL may be formed on the substrate SUB to protect the transistors from moisture permeating through the substrate SUB that is susceptible to moisture permeation, and may also provide a flat surface.

The semiconductor layer may be disposed on the buffer layer BL. The semiconductor layer may include the active layer ACT of the first transistor T1. The active layer ACT may be disposed to partially overlap with a gate electrode G1 of a second conductive layer in the third direction DR3, which will be described later.

The semiconductor layer may include polycrystalline silicon, monocrystalline silicon, an oxide semiconductor, etc. In one or more embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

Although only one first transistor T1 is disposed in the sub-pixel SPXn of the display device 10 in the drawing, the present disclosure is not limited thereto. A larger number of transistors may be included in the display device 10.

A gate insulating layer GI may be disposed on the active layer ACT and the buffer layer BL. The gate insulating layer GI may work as a gate insulating film of the first transistor T1.

The second conductive layer may be disposed on the gate insulating layer GI. The second conductive layer may include a gate electrode G1 of the first transistor T1. The gate electrode G1 may be disposed so that it overlaps a channel region of the active layer ACT in the thickness direction, i.e., the third direction DR3.

An interlayer dielectric layer IL may be disposed on the second conductive layer. The interlayer dielectric layer IL may work as an insulating film between the second conductive layer and other layers disposed thereon and can protect the second conductive layer.

The third conductive layer may be disposed on the interlayer dielectric layer IL. The third conductive layer may include a first voltage line VL1, a second voltage line VL2, and a conductive pattern CDP1.

A high-level voltage (or a first source voltage) may be applied to the first voltage line VL1 to be transmitted to the first electrode RME1, and a low-level voltage (or a second source voltage) may be applied to the second voltage line VL2 to be transmitted to the second electrode RME2. A portion of the first voltage line VL1 may be in contact with the active layer ACT of the first transistor T1 through a contact hole penetrating the interlayer dielectric layer IL and the gate insulating layer GI. The first voltage line VL1 may work as a first drain electrode D1 of the first transistor T1. The second voltage line VL2 may be directly connected to the second electrode RME2 to be described later. Also, the first voltage line VL1 may be electrically connected to the first connection electrode CNE1 to be described later, and the second voltage line VL2 may be electrically connected to the second connection electrode CNE2 to be described later.

The first conductive pattern CDP1 may be in contact with the active layer ACT of the first transistor T1 through a contact hole penetrating the interlayer dielectric layer IL and the gate insulating layer GI. In addition, the first conductive pattern CDP1 may be in contact with the bottom metal layer CAS through another contact hole. The first conductive pattern CDP1 may work as a source electrode S1 of the first transistor T1.

A protective layer PV may be disposed on the third conductive layer and the interlayer dielectric layer IL. The protective layer PV functions as an insulating film between the third conductive layer and other layers disposed thereon and may protect the third conductive layer.

The buffer layer BL, the gate insulating layer GI, the interlayer dielectric layer IL, and the protective layer PV may be made up of (i.e., may include) multiple inorganic layers stacked on one another alternately. For example, the buffer layer BL, the gate insulating layer GI, the interlayer dielectric layer IL, and the protective layer PV may include a double layer in which inorganic layers including at least one of silicon oxide (SiOx), silicon nitride (SiNx) and silicon oxynitride (SiON) are stacked on one another or multiple layers in which they are alternately stacked on one another. It is, however, to be understood that the present disclosure is not limited thereto. The buffer layer BL, the gate insulating layer GI, the interlayer dielectric layer IL, and the protective layer PV may be made up of (i.e., may include) a single inorganic layer including the above-described insulating material. In addition, in one or more embodiments, the interlayer dielectric layer IL may be made of (i.e., may include) an organic insulating material such as polyimide (PI).

The second conductive layer and the third conductive layer may be made up of (i.e., may include) a single layer or multiple layers of one or more selected from among molybdenum (Mo), aluminum (Al), chromium (Cr), gold (Au), titanium (Ti), nickel (Ni), neodymium (Nd) and copper (Cu) and/or an alloy thereof. It is, however, to be understood that the present disclosure is not limited thereto.

A via layer VIA is disposed on the protective layer PV. The via layer VIA may include an organic insulating material, e.g., an organic insulating layer material such as polyimide (PI), to provide a flat surface.

As a display element layer, the plurality of electrodes RME; RME1, RME2 and RME3, the plurality of bank patterns BP1 and BP2, the plurality of light emitting elements ED: ED1, ED2, ED3, and ED4 and the plurality of connection electrodes CNE; CNE1, CNE2, CNE3, CNE4 and CNE5 may be disposed on the via layer VIA. In addition, a plurality of insulating layers PAS1, PAS2, and PAS3 may be disposed on the via layer VIA.

The plurality of bank patterns BP1 and BP2 may be disposed directly on the via layer VIA. The plurality of bank patterns BP1 and BP2 may include first bank patterns BP1 and second bank patterns BP2. The first bank patterns BP1 may be disposed across the emission area EMA and the non-emission area of the sub-pixel SPXn. The first bank patterns BP1 may be disposed across the sub-pixels SPXn adjacent in the second direction DR2. The first bank patterns BP1 may have a shape extending in the second direction DR2 and may be spaced from each other in the first direction DR1. The first bank patterns BP1 may have the same width, but the present disclosure is not limited thereto, and the first bank patterns BP1 may have different width from each other. The length of each of the first bank patterns BP1 extending in the first direction DR1 may be smaller than then the length of the emission area EMA surrounded by the bank layer BNL in the first direction DR1.

The second bank pattern BP2 may be disposed in the emission area EMA of the sub-pixel SPXn and extend in the first direction DR1. The second bank pattern BP2 may be disposed between the first bank patterns BP1 and may be spaced from the first bank patterns BP1. The second bank pattern BP2 may form an island-shaped pattern extending in the first direction DR1 and having a narrow width in the emission area EMA of each sub-pixel SPXn on the entire surface of the display area DPA.

The second bank pattern BP2 is disposed at the center of the emission area EMA, and the first bank patterns BP1 are disposed spaced from the second bank pattern BP2 with the second bank pattern BP2 therebetween. The first bank patterns BP1 and the second bank pattern BP2 may be alternately disposed along the second direction DR2. Light emitting elements ED may be disposed in the space between the first bank patterns BP1 and the second bank pattern BP2.

The first bank patterns BP1 and the second bank pattern BP2 may have the same length in the first direction DR1, but may have different widths in the second direction DR2. A portion of the bank layer BNL extending in the first direction DR1 may overlap the first bank patterns BP1 in the thickness direction (e.g., the third direction DR3). The bank patterns BP1 and BP2 may be arranged on the entire surface of a display area DPA as island patterns.

The bank patterns BP1 and BP2 may protrude at least in part from the top surface of the via layer VIA. Each of protruding parts of the bank patterns BP1 and BP2 may have inclined sides or bent sides. Unlike illustrated in the drawing, each of the configurations of the bank patterns BP1 and BP2 may have a semicircular or semielliptical shape, in a cross-sectional view. The bank patterns BP1 and BP2 may include an organic insulating material such as polyimide, but the present disclosure is not limited thereto.

A plurality of electrodes RME may be disposed in each sub-pixel SPXn to extend in one direction. The electrodes RME may extend in the first direction DR1 to be disposed in and across the emission area EMA and the sub-area SA of the sub-pixel SPXn and may be spaced apart from each other in the second direction DR2.

The electrodes RME includes first, second, and third electrodes RME1, RME2, and RME3. For example, the first electrode RME1 may be disposed at the center of the emission area EMA, the second electrode RME2 may be spaced from the first electrode RME1 in the second direction DR2 and disposed on the right side at the center with respect to the emission area EMA, and the third electrode RME3 may be spaced from the first electrode RME1 in the second direction DR2 and disposed on the left side with respect to the center of the emission area EMA.

The first electrode RME1 may be disposed on the second bank pattern BP2 disposed in the center of the emission area EMA, a portion of the second electrode RME2 may be disposed on the first bank pattern BP1 disposed on the right side of the emission area EMA, and a portion of the third electrode RME3 may be disposed on the first bank pattern BP1 disposed on the left side of the emission area EMA. The plurality of electrodes RME may be disposed on at least inclined side surfaces of each of the bank patterns BP1 and BP2. In one or more embodiments, the first electrode RME1 may have a greater width than the width of the second bank pattern BP2 in the second direction DR2, and the second electrode RME2 and the third electrode RME3 may each have a smaller width than the width of the first bank pattern BP1 in the second direction DR2. At least a portion of each electrode RME may be directly disposed on the via layer VIA, so that the portion of each electrode RME may be disposed on (or at) the same plane.

In one or more embodiments, one first electrode RME1 may be disposed in each sub-pixel SPXn, and the second and third electrodes RME2 and RME3 may be disposed respectively across another sub-pixel SPXn adjacent to each other in the second direction DR2. For convenience of explanation, the second electrode RME2 and the third electrode RME3 are separately named and described, but in practice, the second electrode RME2 and the third electrode RME3 are one electrode. For example, the second electrode RME2 may be the third electrode RME3 from the point of view of another sub-pixel SPXn spaced in the second direction DR2.

The first electrode RME1, the second electrode RME2, and the third electrode RME3 may be connected to the third conductive layer through a first via hole CTD and a second via hole CTS, respectively. The first electrode RME1 may be in contact with a first conductive pattern CDP1 and the first voltage line VL1 through the first via hole CTD, which penetrates the via layer VIA and the protective layer PV. The first via hole CTD may connect the first electrode RME1 to the first conductive pattern CDP1 so that the first source voltage of the first transistor T1 is applied to the first electrode RME1 through the first conductive pattern CDP1. As will be described later, after the light emitting elements ED are aligned, the first electrode RME1 may be separated at the separation part ROP so that a signal is applied from the first transistor T1 through the first via hole CTD and a signal is not applied from the first voltage line VL1.

The second electrode RME2 and the third electrode RME3 may contact a second voltage line VL2 through the second via holes CTS penetrating the via layer VIA and the protective layer PV thereunder. The first electrode RME1 may be electrically connected to the first transistor T1 through the first conductive pattern CDP1 to receive a first source voltage, and the second and third electrodes RME2 and RME3 may be electrically connected to the second voltage line VL2 to receive a second source voltage.

The first electrodes RME1 disposed in different sub-pixels SPXn adjacent to each other in the first direction DR1 may be spaced from each other in the separation part ROP of the sub-area SA. The first electrode RME1 may be disposed by forming one electrode line extending in the first direction DR1, disposing the light emitting elements ED, and then separating the electrode line in a subsequent process. The electrode line may be used to generate an electric field in the sub-pixel SPXn to align the light emitting elements ED during the manufacturing process of the display device 10.

After aligning the light emitting elements ED, the electrode line may be separated from the separation part ROP to form a plurality of electrodes RME spaced from each other in the first direction DR1. The process of separating the electrode line may be performed after the process of forming the second insulating layer PAS2, and the second insulating layer PAS2 may not be disposed in the separation part ROP. The second insulating layer PAS2 may be used as a mask pattern in a process of separating the electrode line.

The plurality of electrodes RME may be electrically connected to the light emitting element ED. Each electrode RME may be connected to the light emitting element ED through the connection electrodes CNE: CNE1, CNE2, CNE3, CNE4, and CNE5 to be described later, and transmit an electrical signal applied from the lower conductive layer to the light emitting element ED.

Each of the plurality of electrodes RME may include a conductive material having high reflectivity. For example, the electrodes RME may include a metal such as silver (Ag), copper (Cu), or aluminum (Al), or include an alloy including aluminum (Al), nickel (Ni), lanthanum (La), and/or the like, as the material having the high reflectivity. The electrodes RME may reflect the light emitted from the light emitting elements ED and traveling toward the side surfaces of the bank patterns BP1 and BP2 in an upward direction of each sub-pixel SPXn.

However, the present disclosure is not limited thereto, and each of the electrodes RME may further include a transparent conductive material. For example, each of the electrodes RME may include a material such as ITO, IZO, or ITZO. In one or more embodiments, each of the electrodes RME may have a structure in which one or more layers made of (i.e., may include) a transparent conductive material and one or more layers made of (i.e., may include) a metal having high reflectivity are stacked or may be formed as one layer including the transparent conductive material and the metal having the high reflectivity. For example, each of the electrodes RME may have a stacked structure such as ITO/Ag/ITO, ITO/Ag/IZO, or ITO/Ag/ITZO/IZO.

The first insulating layer PAS1 may be disposed on the via layer VIA, the bank patterns BP1 and BP2, and the plurality of electrodes RME. The first insulating layer PAS1 may be disposed on the via layer VIA to cover the plurality of electrodes RME and the bank patterns BP1 and BP2. Further, the first insulating layer PAS1 may not be disposed in the separation part ROP of the sub-area SA. The first insulating layer PAS1 may protect the plurality of electrodes RME and at the same time insulate electrodes RME that are different from each other. In addition, the first insulating layer PAS1 may prevent the light emitting elements ED disposed thereon from being damaged by direct contact with other members. In one or more embodiments, a step may be formed such that a portion of the upper surface of the first insulating layer PAS1 is recessed between the electrodes RME that are spaced in the second direction DR2. The light emitting elements ED may be disposed on the upper surface of the first insulating layer PAS1 where the step is formed, and a space may be formed between the light emitting elements ED and the first insulating layer PAS1. The space may be filled with a second insulating layer PAS2 to be described later.

The first insulating layer PAS1 may include a plurality of contacts CT1 and CT2, which expose parts of the top surfaces of the electrodes RME. The plurality of contacts CT1 and CT2 may penetrate the first insulating layer PAS1, and the first connection electrode CNE1 and the second connection electrode CNE2 that will be described later may each be in contact with the electrodes RME exposed by the contacts CT1 and CT2.

The bank layer BNL may be disposed on the first insulating layer PAS1. The bank layer BNL may include parts that extend in the first direction DR1 and parts that extend in the second direction DR2 and may thus be arranged in a ladder-like pattern in a plan view. The bank layer BNL may be disposed along the boundaries of the sub-pixel SPXn to separate the sub-pixel SPXn from other neighboring sub-pixels SPXn. Also, the bank layer BNL may be disposed to be around (e.g., to surround) the emission area EMA and the sub-area SA, and areas that are defined and opened by the bank layer BNL may be the emission area EMA and the sub-area SA.

The bank layer BNL may have a suitable height (e.g., a predetermined height). In one or more embodiments, the height of the bank layer BNL may be greater than the heights of the bank patterns BP1 and BP2, and the thickness of the bank layer BNL may be the same as, or greater than, the thicknesses of the bank patterns BP1 and BP2. However, the present disclosure is not limited thereto, and the height of the bank layer BNL may be the same as, or less than, the heights of the bank patterns BP1 and BP2, and the thickness of the bank layer BNL may be the same as, or smaller than, the thicknesses of the bank patterns BP1 and BP2. The bank layer BNL may prevent ink from spilling over from one sub-pixel SPXn to another sub-pixel SPXn adjacent in the first direction DR1 during inkjet printing as performed during the fabrication of the display device 10. The bank layer BNL may prevent ink having different groups of light emitting elements ED for different sub-pixels SPXn from being mixed together. The bank layer BNL, like the bank patterns BP1 and BP2, may include PI, but the present disclosure is not limited thereto.

The light emitting elements ED may be disposed on the first insulating layer PAS1. Each of the light emitting elements ED may include a plurality of layers that are arranged in a direction parallel to the top surface of the substrate SUB. The light emitting elements ED may be arranged such that a direction in which the light emitting elements ED extend may be parallel to the substrate SUB, and the semiconductor layers included in each of the light emitting elements ED may be sequentially arranged in a direction parallel to the top surface of the substrate SUB. However, the present disclosure is not limited to this. Alternatively, the plurality of layers included in each of the light emitting elements ED may be arranged in a direction perpendicular to the substrate SUB.

The plurality of light emitting elements ED may be disposed between the bank patterns BP1 and BP2 or on different electrodes RME. A portion of the light emitting elements ED may be disposed between the first bank pattern BP1 and the second bank pattern BP2, and the other light emitting elements ED may be disposed between the other first bank pattern BP1 and the second bank pattern BP2.

According to one or more embodiments, the light emitting elements ED may include a first light emitting element ED1 disposed between the first bank pattern BP1 and the second bank pattern BP2 that are disposed at an upper left side in the emission area EMA, a second light emitting element ED2 disposed between the first bank pattern BP1 and the second bank pattern BP2 that are disposed on the upper right side in the emission area EMA, a third light emitting element ED3 disposed between the first bank pattern BP1 and the second bank pattern BP2 that are disposed on the lower left side in the emission area EMA, and a fourth light emitting element ED4 between the first bank pattern BP1 and the second bank pattern BP2 that are disposed on the lower right side in the emission area EMA.

The first light emitting element ED1 and the third light emitting element ED3 may be disposed on the first electrode RME1 and the third electrode RME3, and the second light emitting element ED2 and the fourth light emitting element ED4 may be disposed on the first electrode RME1 and the second electrode RME2. However, the light emitting elements ED are not classified according to their position in the emission area EMA but may be classified according to their connection relationship with the connection electrodes CNE which will be described later. Both ends of each light emitting element ED may contact different connection electrodes CNE according to the arrangement structure of the connection electrodes CNE, and the light emitting elements ED may be classified into different light emitting elements ED according to types of the connection electrodes CNE that they contact.

The light emitting elements ED may be in contact with the connection electrodes CNE: CNE1, CNE2, CNE3, CNE4 and CNE5 so that they may be electrically connected thereto. As a portion of the semiconductor layer of each of the light emitting elements ED is exposed at the end surface on one side of the direction in which they are extended, the exposed portion of the semiconductor layer may be in contact with the contact electrode CNE. Each of the light emitting elements ED may be electrically connected to the conductive layers under the electrode RME or the via layer VIA through the connection electrodes CNE, and an electric signal may be applied to it so that light of a particular wavelength range can be emitted.

The second insulating layer PAS2 may be disposed on the plurality of light emitting elements ED and the first insulating layer PAS1. The second insulating layer PAS2 may extend in the first direction between the bank patterns BP1 and BP2 and include a pattern portion disposed on the plurality of light emitting elements ED. The pattern portion may be disposed to partially surround the outer surfaces (e.g., the outer peripheral or circumferential surfaces) of the light emitting elements ED so that the both sides or both ends of the light emitting elements ED are not covered. The pattern portion may form a linear or island-like pattern in each of the sub-pixels PXn in a plan view. The pattern portion of the second insulating layer PAS2 can protect the light emitting elements ED and fix the light emitting elements ED during the process of fabricating the display device 10.

In addition, the second insulating layer PAS2 may be disposed to fill the space between light emitting elements ED and the first insulating layer PAS1 thereunder. For example, the second insulating layer PAS2 may be formed to completely cover the light emitting elements ED and then patterned to expose both ends of the light emitting elements ED. One portion of the second insulating layer PAS2 may fill a space between the light emitting elements ED and the first insulating layer PAS1 thereunder.

The plurality of connection electrodes CNE1, CNE2, CNE3, CNE4, and CNE5 may include a first connection electrode CNE1, a second connection electrode CNE2, a third connection electrode CNE3, a fourth connection electrode CNE4, and a fifth connection electrode CNE5.

The first connection electrode CNE1 may have a shape extended in the first direction DR1 and may be disposed on the first electrode RME1. A portion of the first connection electrode CNE1 disposed on the first bank pattern BP1 may overlap the first electrode RME1 and extend in the first direction DR1 therefrom, crossing the bank layer BNL, to be disposed up to the sub-area SA located above the emission area EMA. The first connection electrode CNE1 may be electrically connected to at least one of the first electrode RME1 and the first conductive pattern CDP1 in the sub-area SA through the first contact CT1.

The second connection electrode CNE2 may have a shape extended in the first direction DR1 and may be disposed on the second electrode RME2. A portion of the second connection electrode CNE2 disposed on the second bank pattern BP2 may overlap the second electrode RME2 and extend in the first direction DR1 therefrom, crossing the bank layer BNL, to be disposed up to the sub-area SA located below the emission area EMA. The second connection electrode CNE2 may be connected to the second voltage line VL2 or the second electrode RME2 in the sub-area SA through the second contact CT2.

The first connection electrode CNE1 and the second connection electrode CNE2 may be disposed parallel to each other and may be disposed to extend over the emission area EMA and the sub-area SA.

The third connection electrode CNE3 may be disposed to overlap the first electrode RME1 and the third electrode RME3. Specifically, the third connection electrode CNE3 may include a first extension portion CN_E1 and a second extension portion CN_E2 that extend in the first direction DR1, and a first connection portion CN_B1 that connects the first extension portion CN_E1 and the second extension portion CN_E2. The first extension portion CN_E1 is disposed on the third electrode RME3 in the emission area EMA, and the second extension portion CN_E2 is disposed on the first electrode RME1 in the emission area EMA. The first extension portion CN_E1 may be spaced from the first connection electrode CNE1 in the second direction DR2, and the second extension portion CN_E2 may be spaced from the first connection electrode CNE1 in the second direction DR2. The first extension portion CN_E1 and the second extension portion CN_E2 may be disposed adjacent to each other with the first connection electrode CNE1 interposed therebetween. Also, the first extension portion CN_E1 may be disposed to extend from the emission area EMA to the sub-area SA beyond the bank layer BNL. The second extension portion CN_E2 may also be disposed to extend from the emission area EMA to the sub-area SA beyond the bank layer BNL.

The first connection portion CN_B1 may extend in the second direction DR2 from the sub-area SA outside the emission area EMA to connect the first extension portion CN_E1 and the second extension portion CN_E2. The third connection electrode CNE3 may have a shape substantially extending in the first direction DR1, and may have a shape that is bent in the second direction DR2 and extends in the first direction DR1 again toward the emission area EMA. The third connection electrode CNE3 may be disposed on the emission area EMA and the sub-area SA. The third connection electrode CNE3 may transfer a signal applied through the light emitting elements ED. The first light emitting element ED1 and the second light emitting element ED2 may be connected in series through the third connection electrode CNE3.

The fourth connection electrode CNE4 may include a third extension portion CN_E3 disposed on the second electrode RME2, a fourth extension portion CN_E4 and a fifth extension portion CN_E5 disposed on the first electrode RME1, a second connection portion CN_B2 that connects the third extension portion CN_E3 to the fourth extension portion CN_E4, and a third connection portion CN_B3 that connects the fourth extension portion CN_E4 to the fifth extension portion CN_E5.

The third extension portion CN_E3 may be spaced from the second extension portion CN_E2 of the third connection electrode CNE3 in the second direction DR2. The fourth extension portion CN_E4 may be disposed between the first connection electrode CNE1 and the second extension portion CN_E2 of the third connection electrode CNE3 and may be disposed parallel to the first connection electrode CNE1 and the second extension portion CN_E2 of the third connection electrode CNE3. The fifth extension portion CN_E5 may be spaced from a sixth extension portion CN_E6 of the fifth connection electrode CNE5 to be described later in the second direction DR2. The third extension portion CN_E3 and the fourth extension portion CN_E4 may each be disposed above the emission area EMA, and the fifth extension portion CN_E5 may be disposed below the emission area EMA. The second connection portion CN_B2 may be disposed in the sub-area SA and the third connection portion CN_B3 may be disposed in the emission area EMA.

The third extension portion CN_E3 and the fourth extension portion CN_E4 may be disposed adjacent to each other with the second extension portion CN_E2 of the third connection electrode CNE3 interposed therebetween. Also, the third extension portion CN_E3 may be disposed to extend from the emission area EMA to the sub-area SA disposed above the emission area EMA beyond the bank layer BNL. The fourth extension portion CN_E4 may also be disposed to extend from the emission area EMA to the sub-area SA disposed above the emission area EMA beyond the bank layer BNL. The fifth extension portion CN_E5 may extend from the emission area EMA to the top of the bank layer BNL and may not be disposed in the sub-area SA.

The second connection portion CN_B2 may extend in the second direction DR2 from the sub-area SA above the emission area EMA to connect the third extension portion CN_E3 and the fourth extension portion CN_E4. The third connection portion CN_B3 may extend from the center of the emission area EMA in the second direction DR2 to connect the fourth extension portion CN_E4 and the fifth extension portion CN_E5. The fourth connection electrode CNE4 may have a shape substantially extending in the first direction DR1, and may have a shape that is bent in the second direction DR2, extended in the first direction DR1 toward the emission area EMA, bent again in the second direction DR2 and then extended again in the first direction DR1. The fourth connection electrode CNE4 may be disposed on the emission area EMA and the sub-area SA. The fourth connection electrode CNE4 may transmit a signal applied through the light emitting elements ED. The second light emitting element ED2 and the third light emitting element ED3 may be connected in series through the fourth connection electrode CNE4.

The fifth connection electrode CNE5 may include a sixth extension portion CN_E6 disposed on the third electrode RME3, a seventh extension portion CN_E7 disposed on the first electrode RME1, and a fourth connection portion CN_B4 that connects the sixth extension portion CN_E6 and the seventh extension portion CN_E7. The sixth extension portion CN_E6 may be spaced from the fifth extension portion CN_E5 of the fourth connection electrode CNE4 in the second direction DR2, and the seventh extension portion CN_E7 may be spaced from the second connection electrode CNE2 in the second direction DR2. The sixth extension portion CN_E6 and the seventh extension portion CN_E7 may be disposed on the bottom side among the emission area EMA of the corresponding sub-pixel SPXn. The sixth extension portion CN_E6 and the seventh extension portion CN_E7 may be disposed adjacent to each other with the fifth extension portion CN_E5 of the fourth connection electrode CNE4 interposed therebetween. Also, the sixth extension portion CN_E6 and the seventh extension portion CN_E7 may be disposed to extend from the emission area EMA to the sub-area SA disposed below the emission area EMA beyond the bank layer BNL.

The fourth connection portion CN_B4 may extend in the second direction DR2 from the sub-area SA below the emission area EMA to connect the sixth extension portion CN_E6 and the seventh extension portion CN_E7. The fifth connection electrode CNE5 may have a shape substantially extending in the first direction DR1, and may have a shape that is bent in the second direction DR2, then extended in the first direction DR1 toward the emission area EMA. The fifth connection electrode CNE5 may be disposed on the emission area EMA and the sub-area SA. The fifth connection electrode CNE5 may transmit a signal applied through the light emitting elements ED. The third light emitting element ED3 and the fourth light emitting element ED4 may be connected in series through the fifth connection electrode CNE5.

The length of the first connection portion CN_B1 of the third connection electrode CNE3 in the second direction DR2 may be greater than the length of the second connection portion CN_B2 of the fourth connection electrode CNE4 in the second direction DR2. The length of the first connection portion CN_B1 of the third connection electrode CNE3 in the second direction DR2 may be equal to the length of the fourth connection portion CN_B4 of the fifth connection electrode CNE5 in the second direction DR2. The length of each of the first connection portion CN_B1 of the third connection electrode CNE3 and the fourth connection portion CN_B4 of the fifth connection electrode CNE5 in the second direction DR2 may be greater than the length of the third connection portion CN_B3 of the fourth connection electrode CNE4 in the second direction DR2.

The first connection electrode CNE1 and the second connection electrode CNE2 may be first type connection electrodes in contact with the first electrode RME1 and the second electrode RME2 directly connected to the third conductive layer, respectively. The third connection electrode CNE3, the fourth connection electrode CNE4, and the fifth connection electrode CNE5 may be second type connection electrodes that are not in contact with any electrodes RME.

Corresponding to the structures of the connection electrodes CNE described above, the plurality of light emitting elements ED may be divided into different light emitting elements ED according to the connection electrodes CNE in which both ends thereof are in contact. The first connection electrode CNE1 may be in contact with one end of the first light emitting element ED1, and a part (first extension portion CN_E1) of the third connection electrode CNE3 may be in contact with the other end of the first light emitting element ED1. The other part (second extension portion CN_E2) of the third connection electrode CNE3 may be in contact with one end of the second light emitting element ED2, and a part (third extension portion CN_E3) of the fourth connection electrode CNE4 may be in contact with the other end of the second light emitting element ED2. The other part (fifth extension portion CN_E5) of the fourth connection electrode CNE4 may be in contact with one end of the third light emitting element ED3, and a part (sixth extension portion CN_E6) of the fifth connection electrode CNE5 may be in contact with the other end of the third light emitting element ED3. A part (seventh extension portion CN_E7) of the fifth connection electrode CNE5 may be in contact with one end of the fourth light emitting element ED4, and the second connection electrode CNE2 may be in contact with the other end of the fourth light emitting element ED4. The first to fourth light emitting elements ED1, ED2, ED3, and ED4 may not be disposed on the fourth extension portion CN_E4 of the fourth connection electrode CNE4 and may not overlap each other.

One end of the first light emitting element ED1 may be electrically connected to the first electrode RME1 connected to the third conductive layer, and one end of the fourth light emitting element ED4 may also be electrically connected to the second electrode RME2 connected to the third conductive layer. The first light emitting element ED1 and the second light emitting element ED2 may be electrically connected to each other through the third connection electrode CNE3, the second light emitting element ED2 and the third light emitting element ED3 may be electrically connected to each other through the fourth connection electrode CNE4, and the third light emitting element ED3 and the fourth light emitting element ED4 may be electrically connected through the fifth connection electrode CNE5. The first light emitting element ED1, the second light emitting element ED2, the third light emitting element ED3, and the fourth light emitting element ED4 may be connected to each other in series through the plurality of connection electrodes CNE.

The third insulating layer PAS3 is disposed on the first connection electrode CNE1, the second connection electrode CNE2, the fourth connection electrode CNE4, the first insulating layer PAS1, and the second insulating layer PAS2. The third insulating layer PAS3 is disposed to cover the first connection electrode CNE1, the second connection electrode CNE2, and the fourth connection electrode CNE4 so as to insulate the adjacent third connection electrode CNE3 and the fifth connection electrode CNE5 therefrom. The third connection electrode CNE3 and the fifth connection electrode CNE5 may be disposed on the third insulating layer PAS3.

In one or more embodiments, another insulating layer may be further disposed on the third insulating layer PAS3. The insulating layer may function to protect the members disposed on the substrate SUB against the external environment. The first insulating layer PAS1, the second insulating layer PAS2, and the third insulating layer PAS3 described above may include an inorganic insulating material or an organic insulating material.

Referring to FIGS. 8 and 9, the first connection electrode CNE1, the second connection electrode CNE2, and the fourth connection electrode CNE4 may be disposed on (or at) the same layer and may be disposed below the third insulating layer PAS3. The third connection electrode CNE3 and the fifth connection electrode CNE5 may be disposed on (or at) the same layer and may be disposed on the third insulating layer PAS3. The first connection electrode CNE1, the second connection electrode CNE2, and the fourth connection electrode CNE4 may be insulated from the third connection electrode CNE3 and the fifth connection electrode CNE5 with the third insulating layer PAS3 interposed therebetween.

Some of the connection electrodes CNE in one sub-pixel SPXn may overlap each other in the third direction DR3. Specifically, the second extension portion CN_E2 of the third connection electrode CNE3 may overlap the second connection portion CN_B2 of the fourth connection electrode CNE4 with the third insulating layer PAS3 interposed therebetween. The second extension portion CN_E2 of the third connection electrode CNE3 and the second connection portion CN_B2 of the fourth connection electrode CNE4 may be disposed in the sub-area SA other than the emission area EMA. In the sub-area SA, the second extension portion CN_E2 of the third connection electrode CNE3 and the second connection portion CN_B2 of the fourth connection electrode CNE4 cross each other and are overlapped in the third direction DR3 as the second extension portion CN_E2 of the third connection electrode CNE3 extends in the first direction DR1 and the second connection portion CN_B2 of the fourth connection electrode CNE4 extends in the second direction.

An overlapping portion of the second extension portion CN_E2 of the third connection electrode CNE3 and the second connection portion CN_B2 of the fourth connection electrode CNE4 may not overlap with the emission area EMA and may be disposed in the sub-area SA. The overlapping portion of the second extension portion CN_E2 of the third connection electrode CNE3 and the second connection portion CN_B2 of the fourth connection electrode CNE4 may not overlap with the bank layer BNL.

As described above, in an area in which the connection electrodes CNE are disposed facing each other in the second direction DR2, the light emitting elements ED may be connected to the connection electrodes CNE to emit light. On the other hand, in an area in which the connection electrodes CNE facing each other are not disposed, no light may be emitted even when the light emitting elements ED are disposed. In FIG. 8, the area in which the connecting electrodes CNE facing each other are not disposed may correspond to between the first extension portion CN_E1 of the third connection electrode CNE3 and the sixth extension portion CN_E6 of the fifth connection electrode CNE5, between the first connection electrode CNE1 and the third connection portion CN_B3 of the fourth connection electrode CNE4, between the second extension portion CN_E2 of the third connection electrode CNE3 and the seventh extension portion CN_E7 of the fifth connection electrode CNE5, and between the third extension portion CN_E3 of the fourth connection electrode CNE4 and the second connection electrode CNE2. That is, as the distance between the connection electrodes CNE in the first direction DR1 increases, the number of non-emitting light emitting elements ED increases, and as the distance decreases, the number of non-emitting light emitting elements ED decreases.

In the present disclosure, the number of non-emitting light emitting elements ED may be reduced by minimizing or reducing an area in which the aforementioned connection electrodes CNE facing each other are not disposed. To this end, the third connection electrode CNE3 and the fourth connection electrode CNE4 may be disposed to cross and overlap each other. That is, as the third connection electrode CNE3 that includes the first extension portion CN_E1, the first connection portion CN_B1, and the second extension portion CN_E2, and the fourth connection electrode CNE4 that includes the third extension portion CN_E3, the fourth extension portion CN_E4, the fifth extension portion CN_E5, the second connection portion CN_B2 and the third connection portion CN_B3 are formed and the second extension portion CN_E2 of the third connection electrode CNE3 and the second connection portion CN_B2 of the fourth connection electrode CNE4 are superposed, the area in which the connection electrodes CNE facing each other are not disposed may be reduced or minimized.

In accordance with the present embodiment, the number of non-emitting light emitting elements ED in one sub-pixel SPXn may be reduced to a maximum of 3 to 4, which can be calculated as a figure corresponding to about 700 million elements based on a 65-inch 8*k* panel. Accordingly, the display device 10 according to one or more embodiments may improve light emission efficiency by reducing the non-emitting light emitting elements ED.

Figure 10:
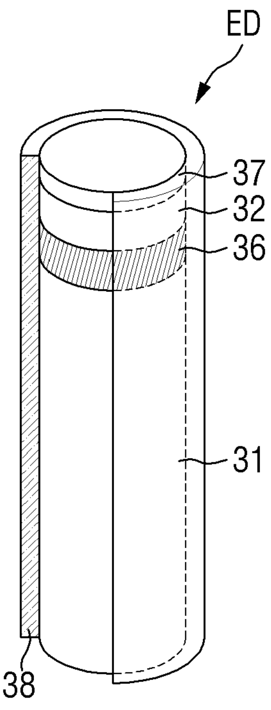
FIG. 10 is a schematic cutaway view of a light emitting element according to one or more embodiments.

FIG. 10 is a schematic cutaway view of a light emitting element according to one or more embodiments.

Referring to FIG. 10, the light emitting element ED may be a light emitting diode. Specifically, the light emitting element ED may be an inorganic light emitting diode that has a nanometer or micrometer size, and may include an inorganic material. The light emitting element ED may be aligned between two electrodes having polarity when an electric field is formed in a specific direction between two electrodes facing each other.

The light emitting element ED according to one or more embodiments may have a shape elongated in one direction. The light emitting element ED may have a shape of a cylinder, a rod, a wire, a tube, and/or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface (e.g., an outer peripheral or circumferential surface) partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of AlxGayIn1-x-yN (0≤x≤1, 0≤y≤1, 0≤x+y≤1). For example, the first semiconductor layer 31 may be one or more selected from among AlGaInN, GaN, AlGaN, InGaN, AlN and/or InN doped with an n-type dopant. The n-type dopant doped into the first semiconductor layer 31 may be Si, Ge, Sn, Se, and/or the like.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of AlxGayIn1-x-yN (0≤x≤1, 0≤y≤1, 0≤x+y≤1). For example, the second semiconductor layer 32 may be one or more selected from among AlGaInN, GaN, AlGaN, InGaN, AlN and/or InN doped with a p-type dopant. The p-type dopant doped into the second semiconductor layer 32 may be Mg, Zn, Ca, Ba, and/or the like.

Although it is illustrated in the drawing that the first semiconductor layer 31 and the second semiconductor layer 32 are configured as one layer, the present disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. A semiconductor layer disposed between the first semiconductor layer 31 and the light emitting layer 36 may be one or more selected from among AlGaInN, GaN, AlGaN, InGaN, AlN and/or InN doped with an n-type dopant, and a semiconductor layer disposed between the second semiconductor layer 32 and the light emitting layer 36 may be one or more selected from among AlGaInN, GaN, AlGaN, InGaN, AlN and/or InN doped with a p-type dopant.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. In particular, when the light emitting layer 36 has a multiple quantum well structure in which quantum layers and well layers are alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other Group III to V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode. However, the present disclosure is not limited thereto, and it may be a Schottky connection electrode. The light emitting element ED may include at least one electrode layer 37. The light emitting element ED may include one or more electrode layers 37, but the present disclosure is not limited thereto, and the electrode layer 37 may be omitted.

In the display device 10, when the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is disposed to be around (e.g., to surround) the outer surfaces (e.g., the outer peripheral or circumferential surfaces) of the plurality of semiconductor layers and electrode layers described above. For example, the insulating film 38 may be disposed to be around (e.g., to surround) at least the outer surface (e.g., the outer peripheral or circumferential surface) of the light emitting layer 36, and may be formed to expose both ends of the light emitting element ED in the longitudinal direction. Further, in cross-sectional view, the insulating film 38 may have a top surface, which is rounded in a region adjacent to at least one end of the light emitting element ED.

The insulating film 38 may include at least one of materials having insulating properties, for example, silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx). It is illustrated in the drawing that the insulating film 38 is formed as a single layer, but the present disclosure is not limited thereto. In one or more embodiments, the insulating film 38 may be formed in a multilayer structure having a plurality of layers stacked therein.

The insulating film 38 may perform a function of protecting the semiconductor layers and the electrode layer of the light emitting element ED. The insulating film 38 may prevent an electrical short circuit that is likely to occur at the light emitting layer 36 when an electrode to which an electrical signal is transmitted is in direct contact with the light emitting element ED. In addition, the insulating film 38 may prevent a decrease in luminous efficiency of the light emitting element ED.

Further, the insulating film 38 may have an outer surface (e.g., an outer peripheral or circumferential surface), which is surface-treated. The light emitting elements ED may be aligned in such a way of spraying the ink in which the light emitting elements ED are dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Hereinafter, various embodiments of the display device 10 will be described with reference to other drawings.

Figure 11:
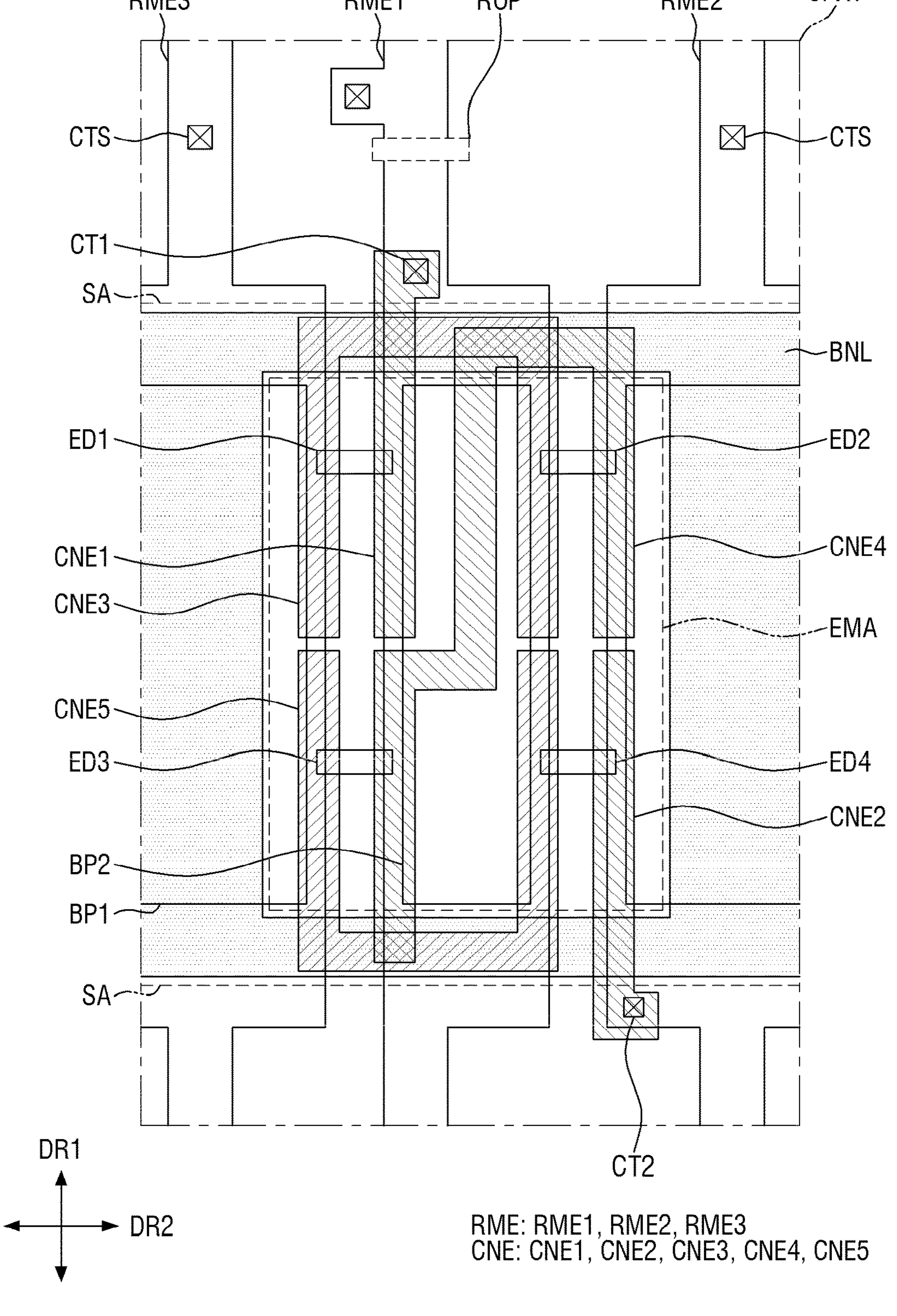
FIG. 11 is a plan view of illustrating a first sub-pixel of a display device according to one or more embodiments.
Figure 12:
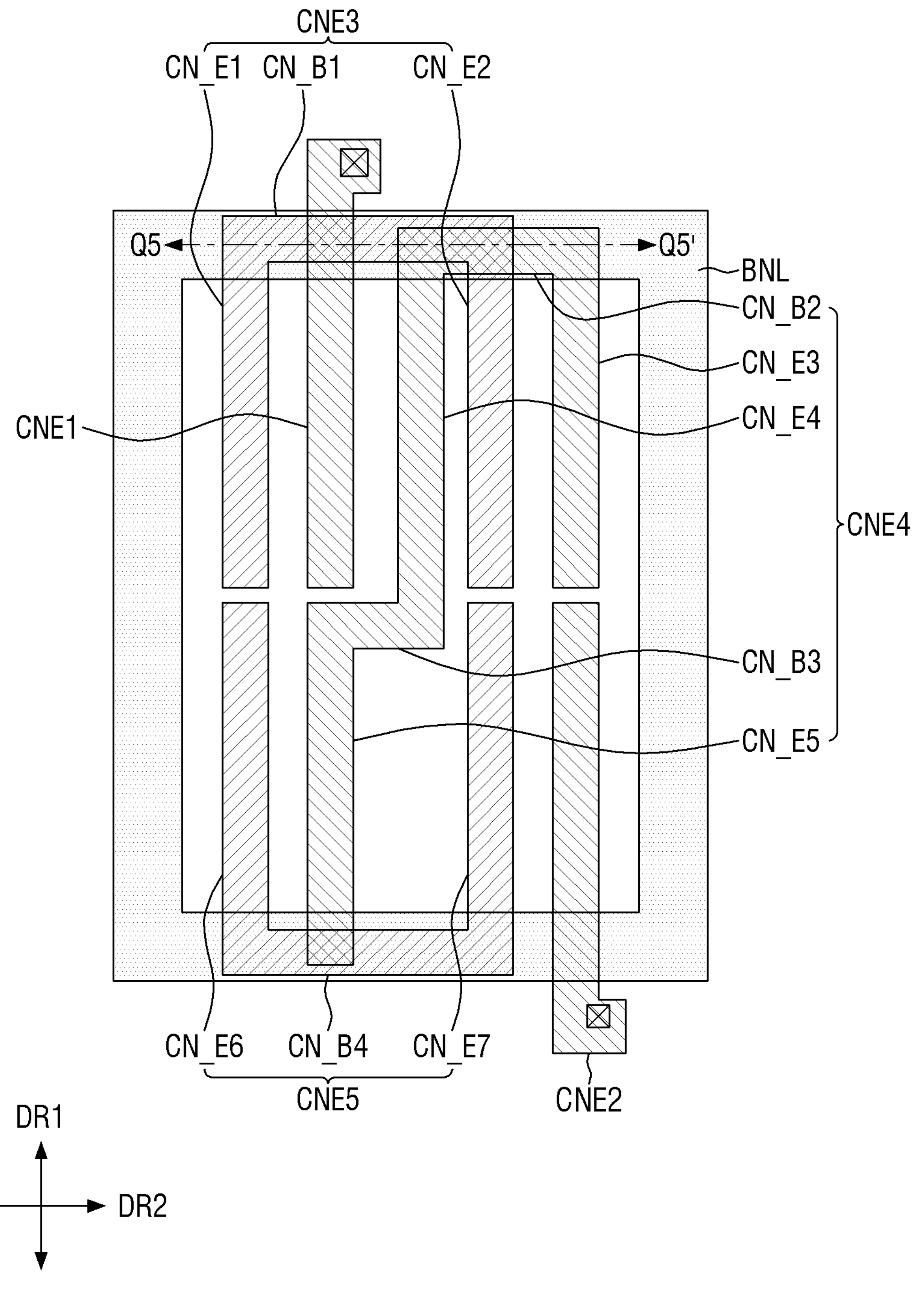
FIG. 12 is a plan view of illustrating a bank layer and connection electrodes of the first sub-pixel of FIG. 11.
Figure 13:
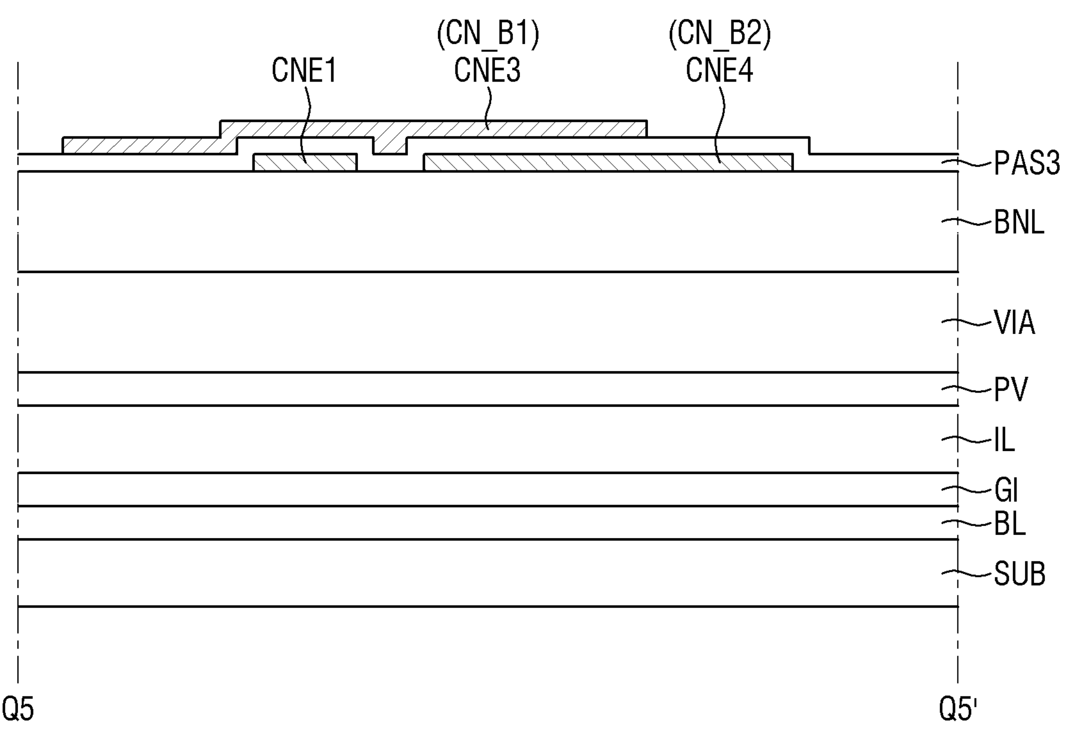
FIG. 13 is a cross-sectional view taken along the line Q5-Q5' of FIG. 12.

FIG. 11 is a plan view of illustrating a first sub-pixel of a display device according to one or more embodiments. FIG. 12 is a plan view of illustrating a bank layer and connection electrodes of the first sub-pixel of FIG. 11. FIG. 13 is a cross-sectional view taken along the line Q5-Q5' of FIG. 12.

Referring to FIGS. 11 to 13, the present embodiments are different from the embodiments of FIGS. 4 to 10 in that the first connection portion CN_B1 of the third connection electrode CNE3, the second connection portion CN_B2 of the fourth connection electrode CNE4, and the fourth connection portion CN_B4 of the fifth connection electrode CNE5 are disposed on the bank layer BNL. Hereinafter, a description of contents overlapping those of the above-described embodiment will be omitted, and contents different from those of the above-described embodiment will be described.

The third connection electrode CNE3 may include a first extension portion CN_E1, a second extension portion CN_E2, and a first connection portion CN_B1 connecting the first extension portion CN_E1 and the second extension portion CN_E2. The first extension portion CN_E1 may be disposed to extend from the emission area EMA to the bank layer BNL, and the second extension portion CN_E2 may be disposed to extend from the emission area EMA to the bank layer BNL. One end of the first extension portion CN_E1 may be disposed on the bank layer BNL and not extend to the sub-area SA, and one end of the second extension portion CN_E2 may be disposed on the bank layer BNL and not extend to the sub-area SA.

The first connection portion CN_B1 may extend in the second direction DR2 on the bank layer BNL to connect the first extension portion CN_E1 and the second extension portion CN_E2. The first connection portion CN_B1 may not overlap the light emission area EMA and the sub-area SA, and may overlap the bank layer BNL. In one or more embodiments, the first connection portion CN_B1 may completely overlap the bank layer BNL. The third connection electrode CNE3 may be disposed on the emission area EMA and the bank layer BNL.

The fourth connection electrode CNE4 may include the third extension portion CN_E3, the fourth extension portion CN_E4, the fifth extension portion CN_E5, the second connection portion CN_B2 that connects the third extension portion CN_E3 and the fourth extension portion CN_E4, and the third connection portion CN_B3 that connects the fourth extension portion CN_E4 and fifth extension portion CN_E5.

The third extension portion CN_E3 may be disposed to extend from the emission area EMA to the bank layer BNL, and the fourth extension portion CN_E4 may be disposed to extend from the emission area EMA to the bank layer BNL. The fifth extension portion CN_E5 may be disposed to extend from the emission area EMA to the bank layer BNL. One end of the third extension portion CN_E3 may be disposed on the bank layer BNL and not extend to the sub-area SA, and one end of the fourth extension portion CN_E4 may be disposed on the bank layer BNL and not extend into the sub-area SA. In addition, one end of the fifth extension portion CN_E5 may be disposed on the bank layer BNL and not extend into the sub-area SA.

The second connection portion CN_B2 may extend in the second direction DR2 on the bank layer BNL to connect the third extension portion CN_E3 and the fourth extension portion CN_E4. The second connection portion CN_B2 does not overlap the emission area EMA and the sub-area SA, and may overlap the bank layer BNL. In one or more embodiments, the second connection portion CN_B2 may completely overlap the bank layer BNL. Accordingly, the fourth connection electrode CNE4 may be disposed on the emission area EMA and the bank layer BNL.

The fifth connection electrode CNE5 may include the sixth extension portion CN_E6, the seventh extension portion CN_E7, and the fourth connection portion CN_B4 connecting the sixth extension portion CN_E6 and the seventh extension portion CN_E7.

The sixth extension portion CN_E6 may be disposed to extend from the emission area EMA to the bank layer BNL, and the seventh extension portion CN_E7 may be disposed to extend from the emission area EMA to the bank layer BNL. One end of the sixth extension portion CN_E6 may be disposed on the bank layer BNL and not extend to the sub-area SA, and one end of the seventh extension portion CN_E7 may be disposed on the bank layer BNL and not extend into the sub-area SA.

The fourth connection portion CN_B4 may extend in the second direction DR2 on the bank layer BNL to connect the sixth extension portion CN_E6 and the seventh extension portion CN_E7. The fourth connection portion CN_B4 may not overlap the emission area EMA and the sub-area SA, and may overlap the bank layer BNL. In one or more embodiments, the fourth connection portion CN_B4 may completely overlap the bank layer BNL. Accordingly, the fifth connection electrode CNE5 may be disposed on the emission area EMA and the bank layer BNL.

Some of the connection electrodes CNE in one sub-pixel SPXn may overlap each other in the third direction DR3. Specifically, the first connection portion CN_B1 and the second extension portion CN_E2 of the third connection electrode CNE3 may overlap the second connection portion CN_B2 of the fourth connection electrode CNE4 with the third insulating layer PAS3 interposed therebetween. The first connection portion CN_B1 and the second extension portion CN_E2 of the third connection electrode CNE3 may be disposed on the bank layer BNL, and the second connection portion CN_B2 of the fourth connection electrode CNE4 may be disposed on the bank layer BNL. On the bank layer BNL, the first connection portion CN_B1 of the third connection electrode CNE3 may extend in the second direction DR2, the second extension portion CN_E2 may extend in the first direction DR1, and the second connection portion CN_B2 of the fourth connection electrode CNE4 may extend in the second direction DR2. The first connection portion CN_B1 of the third connection electrode CNE3 and the second connection portion CN_B2 of the fourth connection electrode CNE4 may be parallel to each other on the bank layer BNL and may overlap each other in the third direction DR3. In addition, the second extension portion CN_E2 of the third connection electrode CNE3 and the second connection portion CN_B2 of the fourth connection electrode CNE4 may cross each other on the bank layer BNL and overlap each other in the third direction DR3.

In addition, the fifth extension portion CN_E5 of the fourth connection electrode CNE4 may overlap the fourth connection portion CN_B4 of the fifth connection electrode CNE5 with the third insulating layer PAS3 interposed therebetween. The fourth connection portion CN_B4 of the fifth connection electrode CNE5 may be disposed on the bank layer BNL, and one end of the fifth extension portion CN_E5 of the fourth connection electrode CNE4 may be disposed on the bank layer BNL. On the bank layer BNL, the fourth connection portion CN_B4 of the fifth connection electrode CNE5 may extend in the second direction DR2, and the fifth extension portion CN_E5 of the fourth connection electrode CNE4 may extend in the first direction DR1. The fifth extension portion CN_E5 of the fourth connection electrode CNE4 and the fourth connection portion CN_B4 of the fifth connection electrode CNE5 may cross each other on the bank layer BNL and overlap each other in the third direction DR3.

In addition, the first connection portion CN_B1 of the third connection electrode CNE3 may overlap the first connection electrode CNE1 with the third insulating layer PAS3 interposed therebetween. The first connection electrode CNE1 may be disposed to extend from the emission area EMA to the sub-area SA beyond the bank layer BNL. On the bank layer BNL, the first connection portion CN_B1 of the third connection electrode CNE3 may extend in the second direction DR2, and the first connection electrode CNE1 may extend in the first direction DR1. The first connection portion CN_B1 of the third connection electrode CNE3 and the first connection electrode CNE1 may cross each other on the bank layer BNL and overlap each other in the third direction DR3.

In one or more embodiments, the connection electrodes CNE are disposed in the area partitioned by the bank layer BNL, including the bank layer BNL, thereby simplifying the structure of the sub-areas SA and increasing the number of light emitting elements ED emitting light within the emission area EMA in which the light emitting elements ED are applied.

Figure 14:
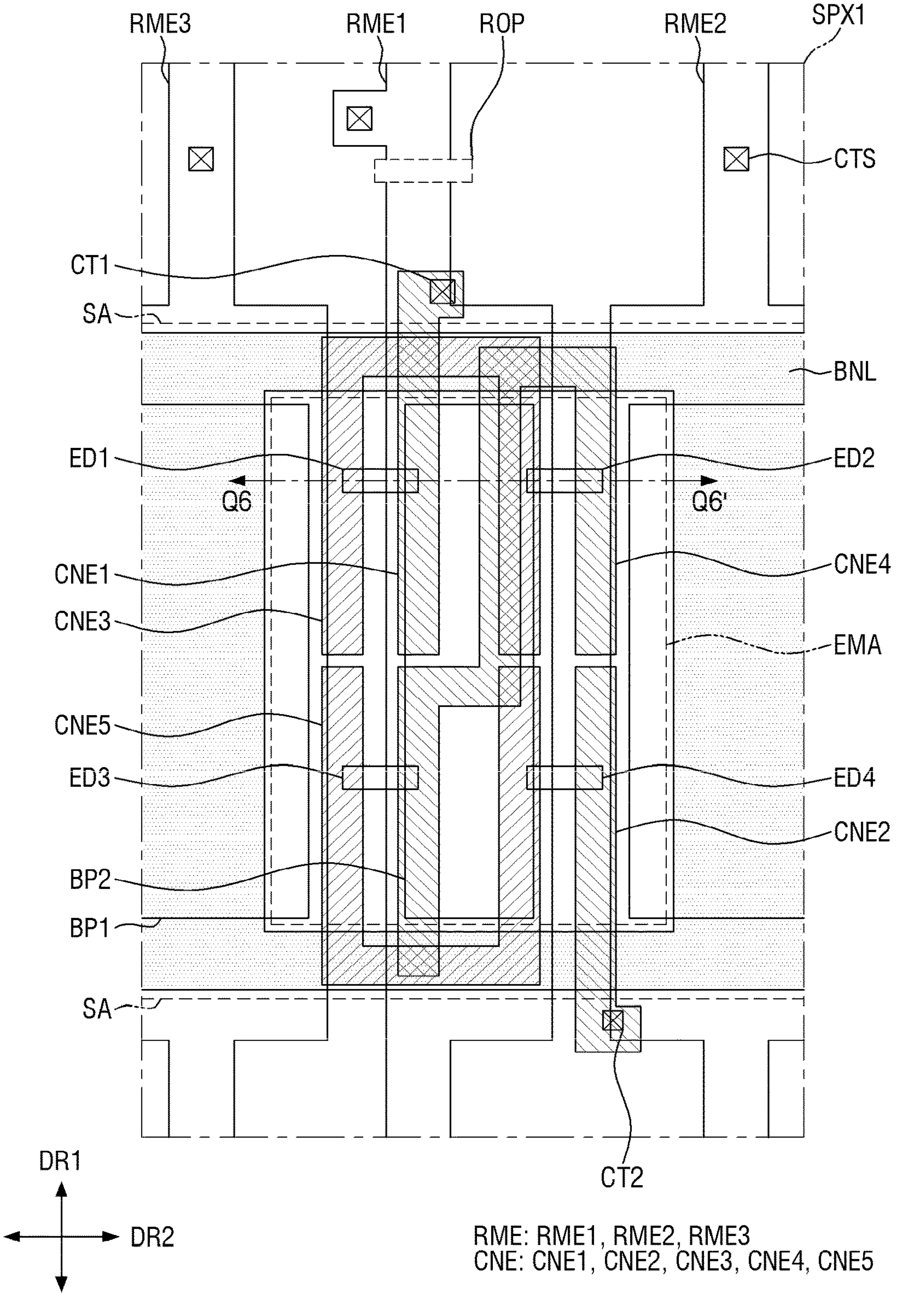
FIG. 14 is a plan view illustrating a first sub-pixel of a display device according to one or more embodiments.
Figure 15:
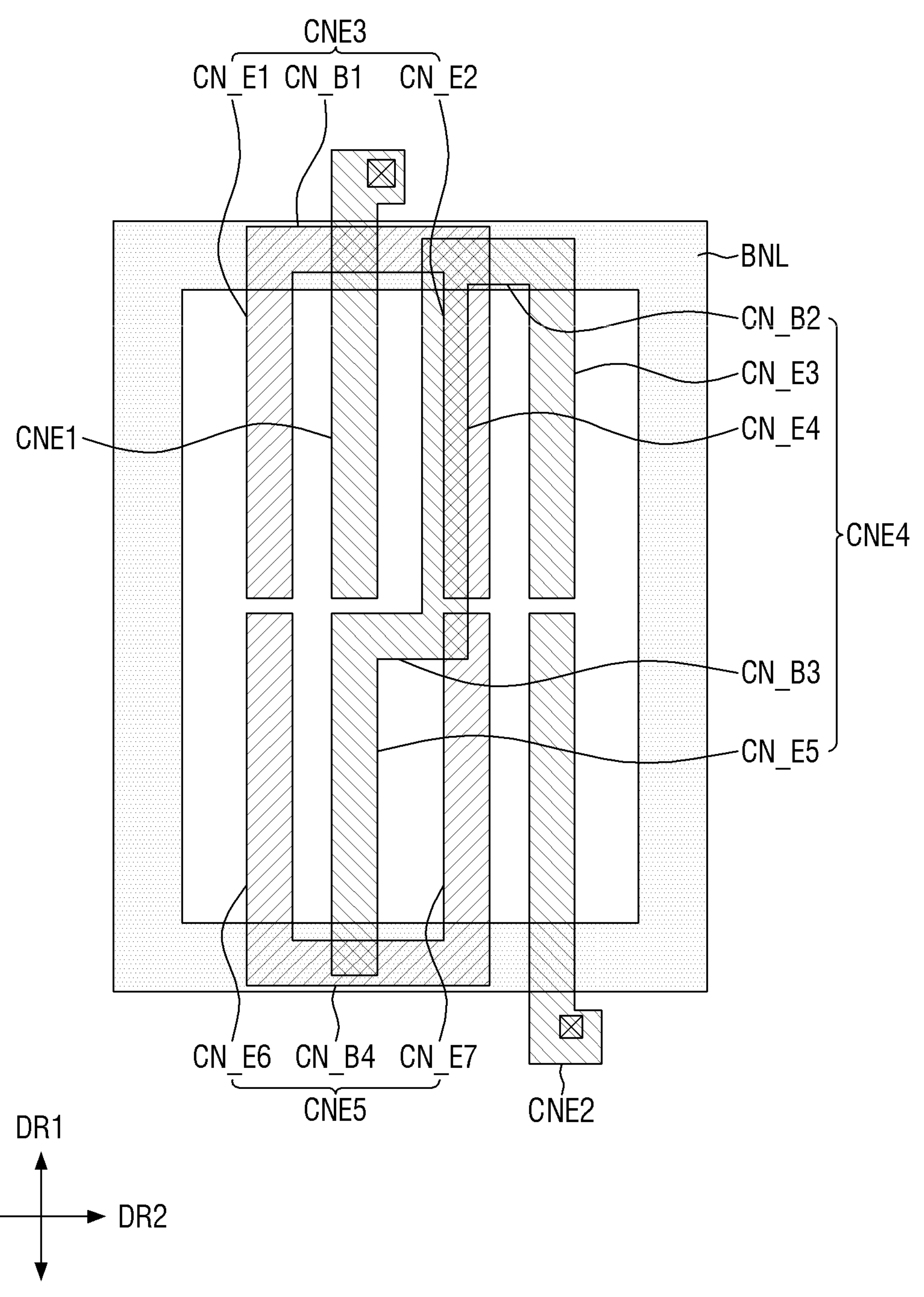
FIG. 15 is a plan view illustrating a bank layer of the first sub-pixel and the connection electrodes of FIG. 14.
Figure 16:
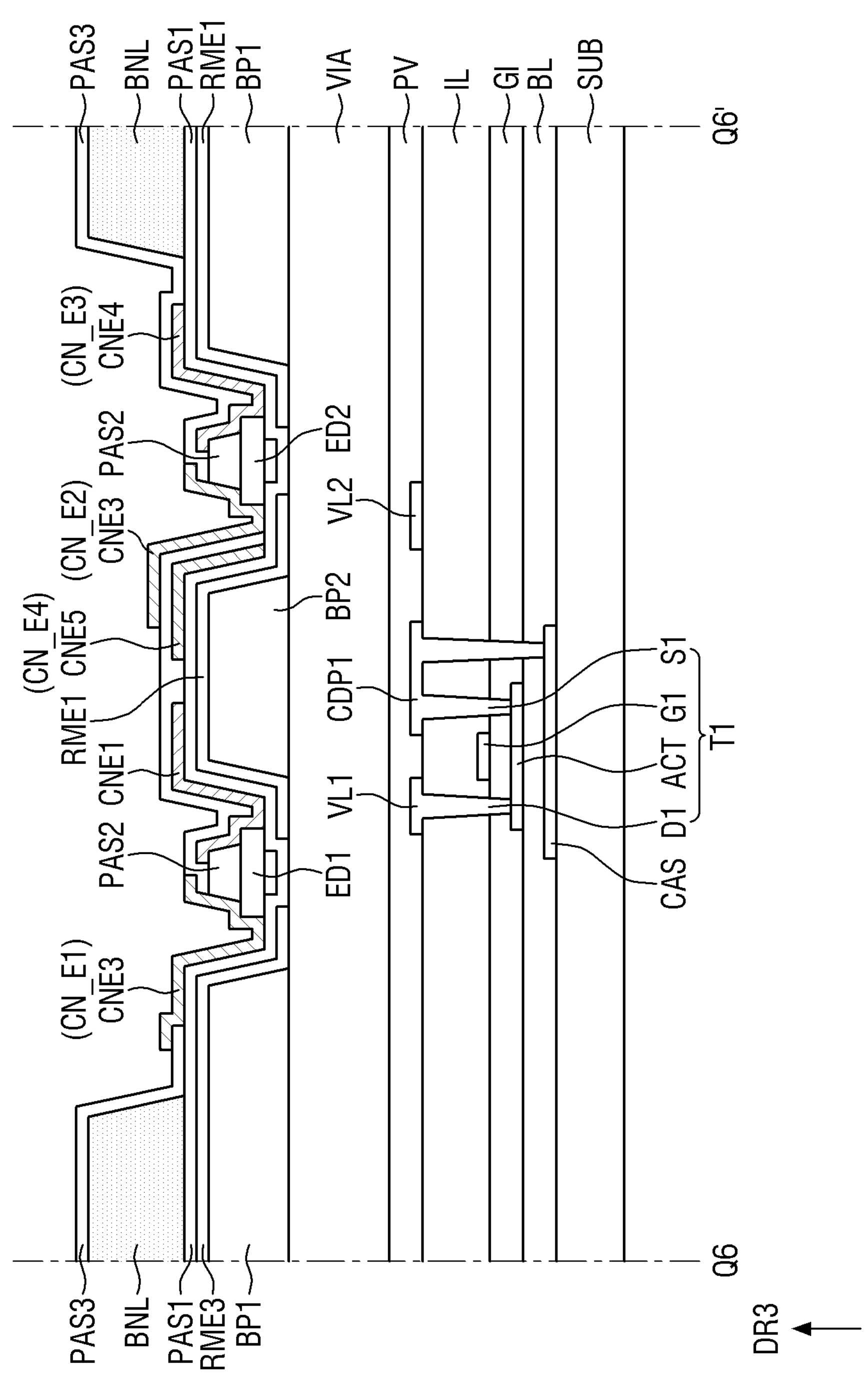
FIG. 16 is a cross-sectional view taken along the line Q6-Q6' of FIG. 14.

FIG. 14 is a plan view illustrating a first sub-pixel of a display device according to one or more embodiments. FIG. 15 is a plan view illustrating a bank layer of the first sub-pixel and the connection electrodes of FIG. 14. FIG. 16 is a cross-sectional view taken along the line Q6-Q6' of FIG. 14.

Referring to FIGS. 14 to 16, the present embodiments are different from the embodiments of FIGS. 11 to 13 in that the second extension portion CN_E2 of the third connection electrode CNE3 and the fourth extension portion CN_E4 of the fourth connection electrode CNE4 overlap each other, and the third connection portion CN_B3 of the fourth connection electrode CNE4 and the seventh extension portion CN_E7 of the fifth connection electrode CNE5 overlap each other. Hereinafter, a description of contents overlapping those of the above-described embodiment will be omitted, and contents different from those of the above-described embodiment will be described.

The second extension portion CN_E2 of the third connection electrode CNE3 may overlap the fourth extension portion CN_E4 of the fourth connection electrode CNE4 with the third insulating layer PAS3 interposed therebetween. The second extension portion CN_E2 of the third connection electrode CNE3 may be disposed to extend from the bank layer BNL to the emission area EMA, and the fourth extension portion CN_E4 of the fourth connection electrode CNE4 may be disposed to extend from the bank layer BNL to the emission area EMA. On the emission area EMA, the second extension portion CN_E2 of the third connection electrode CNE3 may extend in the first direction DR1, and the fourth extension portion CN_E4 of the fourth connection electrode CNE4 may extend in the first direction DR1. The second extension portion CN_E2 of the third connection electrode CNE3 and the fourth extension portion CN_E4 of the fourth connection electrode CNE4 may be parallel to each other on the emission area EMA and overlap in the third direction DR3. In one or more embodiments, the left portion of the second extension portion CN_E2 of the third connection electrode CNE3 in a plan view may overlap the right portion of the fourth extension portion CN_E4 of the fourth connection electrode CNE4 in a plan view.

The third connection portion CN_B3 of the fourth connection electrode CNE4 may overlap the seventh extension portion CN_E7 of the fifth connection electrode CNE5 with the third insulating layer PAS3 interposed therebetween. The third connection portion CN_B3 of the fourth connection electrode CNE4 may be disposed to extend in the second direction DR2 on the emission area EMA, and the seventh extension portion CN_E7 of the fifth connection electrode CNE5 may be disposed to extend to the emission area EMA along the first direction DR1. The third connection portion CN_B3 of the fourth connection electrode CNE4 and the seventh extension portion CN_E7 of the fifth connection electrode CNE5 may be parallel to each other on the emission area EMA and overlap in the third direction DR3. In one or more embodiments, the right portion of the third connection portion CN_B3 of the fourth connection electrode CNE4 in a plan view may overlap the upper portion of the seventh extension portion CN_E7 of the fifth connection electrode CNE5 in a plan view.

The structure of the connection electrode CNE of FIGS. 14 to 16 is similar to the structure of the connection electrode CNE of FIGS. 11 to 13 described above, but the first connection portion CN_B1 of the third connection electrode CNE3, the second and third connection portions CN_B2 and CN_B3 of the fourth connection electrode CNE4 and the fourth connection portion CN_B4 of the fifth connection electrode CNE5 may have different lengths in the second direction DR2. For example, compared to the embodiments of FIGS. 11 to 13, the each of the lengths of the first connection portion CN_B1 of the third connection electrode CNE3, the second connection portion CN_B2 of the fourth connection electrode CNE4, and the fourth connection portion CN_B4 of the fifth connection electrode CNE5 in the second direction DR2 may be shortened, and the length of the third connection portion CN_B3 of the fourth connection electrode CNE4 in the second direction DR2 is may be elongated.

The length of the first connection portion CN_B1 of the third connection electrode CNE3 in the second direction DR2 may be greater than the length of the second connection portion CN_B2 of the fourth connection electrode CNE4 in the second direction DR2. The length of the first connection portion CN_B1 of the third connection electrode CNE3 in the second direction DR2 may be equal to the length of the fourth connection portion CN_B4 of the fifth connection electrode CNE5 in the second direction DR2. The length of each of the first connection portion CN_B1 of the third connection electrode CNE3 and the fourth connection portion CN_B4 of the fifth connection electrode CNE5 in the second direction DR2 may be greater than the length of the third connection portion CN_B3 of the fourth connection electrode CNE4 in the second direction DR2.

In one or more embodiments, the lengths of the connection portions of some connection electrodes CNE may be shortened so that the second extension portion CN_E2 of the third connection electrode CNE3, the fourth extension portion CN_E4 of the fourth connection electrode CNE4, the third connection portion CN_B3 of the fourth connection electrode CNE4 and the seventh extension portion CN_E7 of the fifth connection electrode CNE5 are formed to overlap each other. Accordingly, a distance between the first light emitting element ED1 disposed between the first extension portion CN_E1 of the third connection electrode CNE3 and the first connection electrode CNE1, and the second light emitting element ED2 disposed between the second extension portion CN_E2 of the third connection electrode CNE3 and the third extension portion CN_E3 of the fourth connection electrode CNE4 may be reduced. In addition, a distance between the third light emitting element ED3 disposed between the fifth extension portion CN_E5 of the fourth connection electrode CNE4 and the sixth extension portion CN_E6 of the fifth connection electrode CNE5, and the fourth light emitting element ED4 disposed between the seventh extension portion CN_E7 of the fifth connection electrode CNE5 and the second connection electrode CNE2 may be reduced.

By reducing the distance between the light emitting elements ED facing each other and disposed side by side, each light emitting element ED may be disposed adjacent to the center of the emission area EMA. That is, the light emitted from the light emitting elements ED may be concentrated at the center of the emission area EMA and emitted, thereby increasing light emission efficiency and improving color conversion efficiency when a color conversion layer is disposed thereon.

In concluding the detailed description, those skilled in the art will appreciate that many variations and modifications can be made to the embodiments without substantially departing from the principles of the present disclosure. Therefore, the embodiments of the present disclosure are used in a generic and descriptive sense only and not for purposes of limitation.

What is claimed is:

1. A display device, comprising:

electrodes comprising a first electrode, a second electrode, and a third electrode extending in a first direction and spaced in a second direction crossing the first direction;

a first light emitting element, a second light emitting element, a third light emitting element, and a fourth light emitting element on the electrodes spaced in the second direction;

a first connection electrode on the first electrode and connected to one end of the first light emitting element;

a second connection electrode on the second electrode and connected to one end of the fourth light emitting element;

a third connection electrode on the first electrode and the third electrode, and connected to an other end of the first light emitting element and one end of the second light emitting element;

a fourth connection electrode on the first electrode and the second electrode, and connected to an other end of the second light emitting element and one end of the third light emitting element;

a fifth connection electrode on the first electrode and the third electrode, and connected to an other end of the third light emitting element and an other end of the fourth light emitting element; and an insulating layer between the third connection electrode and the fourth connection electrode, wherein the third connection electrode and the fourth connection electrode overlap each other having the insulating layer disposed therebetween.

2. The display device of claim 1, wherein the third connection electrode comprises a first extension portion extending in the first direction, a second extension portion parallel to the first extension portion, and a first connection portion connecting the first extension portion and the second extension portion, and wherein the fourth connection electrode comprises a third extension portion extending in the first direction, a fourth extension portion parallel to the third extension portion, and a second connection portion connecting the third extension portion and the fourth extension portion.

3. The display device of claim 2, wherein the first connection portion of the third connection electrode and the second connection portion of the fourth connection electrode extend in the second direction, and wherein the second extension portion of the third connection electrode and the second connection portion of the fourth connection electrode overlap each other.

4. The display device of claim 2, further comprising a bank layer on the first electrode, the second electrode, and the third electrode to divide an emission area where the first light emitting element, the second light emitting element, the third light emitting element, and the fourth light emitting element are located, and a sub-area other than the emission area.

5. The display device of claim 4, wherein the first connection portion of the third connection electrode and the second connection portion of the fourth connection electrode are in the sub-area, and wherein the first connection portion and the second connection portion do not overlap each other in the sub-area.

6. The display device of claim 4, wherein the first extension portion, the second extension portion, the third extension portion, and the fourth extension portion cross the bank layer to extend to the sub-area.

7. The display device of claim 4, wherein the fourth connection electrode comprises a fifth extension portion extending in the first direction, and a third connection portion connecting the fifth extension portion and the fourth extension portion, and wherein the third connection portion extends in the second direction and is in the emission area.

8. The display device of claim 7, wherein the fifth connection electrode comprises a sixth extension portion extending in the first direction, a seventh extension portion parallel to the sixth extension portion and a fourth connection portion connecting the sixth extension portion and the seventh extension portion, and wherein the fourth connection portion extends in the second direction and is in the sub-area.

9. The display device of claim 8, wherein the fifth extension portion of the fourth connection electrode is connected to the one end of the third light emitting element, the sixth extension portion of the fifth connection electrode is connected to the other end of the third light emitting element, the seventh extension portion of the fifth connection electrode is connected to the one end of the fourth light emitting element, and the second connection electrode is connected to the other end of the fourth light emitting element.

10. The display device of claim 2, wherein the fourth extension portion of the fourth connection electrode is between the first electrode and the second extension portion of the third connection electrode, and does not overlap the first light emitting element, the second light emitting element, the third light emitting element, and the fourth light emitting element.

11. The display device of claim 2, wherein the first connection electrode is connected to the one end of the first light emitting element, wherein the first extension portion of the third connection electrode is connected to the other end of the first light emitting element, wherein the second extension portion of the third connection electrode is connected to the one end of the second light emitting element, and wherein the third extension portion of the fourth connection electrode is connected to the other end of the second light emitting element.

12. The display device of claim 1, wherein the first connection electrode, the second connection electrode, and the fourth connection electrode are under the insulating layer, and wherein the third connection electrode and the fifth connection electrode are on the insulating layer.

13. A display device, comprising:

electrodes comprising a first electrode, a second electrode, and a third electrode extending in a first direction and spaced in a second direction crossing the first direction;

a first light emitting element, a second light emitting element, a third light emitting element, and a fourth light emitting element on the electrodes spaced in the second direction;

a bank layer on the first electrode, the second electrode, and the third electrode to divide an emission area where the first light emitting element, the second light emitting element, the third light emitting element, and the fourth light emitting element are located and a sub-area other than the emission area;

a first connection electrode on the first electrode and connected to one end of the first light emitting element;

a second connection electrode on the second electrode and connected to one end of the fourth light emitting element;

a third connection electrode on the first electrode and the third electrode, and connected to an other end of the first light emitting element and one end of the second light emitting element;

a fourth connection electrode on the first electrode and the second electrode, and connected to an other end of the second light emitting element and one end of the third light emitting element;

a fifth connection electrode on the first electrode and the third electrode, and connected to an other end of the third light emitting element and an other end of the fourth light emitting element; and an insulating layer between the third connection electrode and the fourth connection electrode and between the fourth connection electrode and the fifth connection electrode; and wherein the third connection electrode and the fourth connection electrode overlap each other on the bank layer, and wherein the fourth connection electrode and the fifth connection electrode overlap each other on the bank layer.

14. The display device of claim 13, wherein the third connection electrode comprises a first extension portion extending in the first direction, a second extension portion parallel to the first extension portion, and a first connection portion connecting the first extension portion and the second extension portion, wherein the fourth connection electrode comprises a third extension portion extending in the first direction, a fourth extension portion parallel to the third extension portion, a fifth extension portion extending in the first direction, a second connection portion connecting the third extension portion and the fourth extension portion, and a third connection portion connecting the fourth extension portion and the fifth extension portion, wherein the fifth connection electrode comprises a sixth extension portion extending in the first direction, a seventh extension portion parallel to the sixth extension portion, and a fourth connection portion connecting the sixth extension portion and the seventh extension portion.

15. The display device of claim 14, wherein, on the bank layer, the first connection portion of the third connection electrode and the second connection portion of the fourth connection electrode overlap each other, and the fifth extension portion of the fourth connection electrode and the fourth connection portion of the fifth connection electrode overlap each other.

16. The display device of claim 14, wherein, on the bank layer, the first connection electrode and the first connection portion of the third connection electrode overlap each other, and the second extension portion of the third connection electrode and the second connection portion of the fourth connection electrode overlap each other.

17. The display device of claim 14, wherein the second extension portion of the third connection electrode is parallel to the fourth extension portion of the fourth connection electrode and does not overlap each other.

18. The display device of claim 14, wherein the second extension portion of the third connection electrode is parallel to the fourth extension portion of the fourth connection electrode and overlap each other.

19. The display device of claim 18, wherein the third connection portion of the fourth connection electrode overlaps the seventh extension portion of the fifth connection electrode in the emission area.

20. The display device of claim 14, wherein the length of the first connection portion of the third connection electrode is the same as the length of the fourth connection portion of the fifth connection electrode, and wherein each of the lengths of the first connection portion of the third connection electrode and the fourth connection portion of the fifth connection electrode is greater than the length of the second connection portion.

* * * * *